D US008576628B2

(12) United States Patent
Ueda

(10) Patent No.: US 8,576,628 B2
(45) Date of Patent: Nov. 5, 2013

(54) NONVOLATILE RANDOM ACCESS MEMORY

(75) Inventor: Naoki Ueda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 377 days.

(21) Appl. No.: 12/863,234

(22) PCT Filed: Jan. 6, 2009

(86) PCT No.: PCT/JP2009/050013
§ 371 (c)(1),
(2), (4) Date: Jan. 12, 2011

(87) PCT Pub. No.: WO2009/090892
PCT Pub. Date: Jul. 23, 2009

(65) Prior Publication Data
US 2011/0116316 A1    May 19, 2011

(30) Foreign Application Priority Data

Jan. 18, 2008  (JP) .................................. 2008-009746

(51) Int. Cl.
*G11C 11/34* (2006.01)
*G11C 16/04* (2006.01)

(52) U.S. Cl.
USPC ................................. 365/185.18; 365/185.24

(58) Field of Classification Search
USPC ........................ 365/185.18, 185.24
See application file for complete search history.

(56) References Cited

U.S. PATENT DOCUMENTS

| | | | |
|---|---|---|---|
| 5,396,461 A | 3/1995 | Fukumoto | |
| 5,465,231 A | 11/1995 | Ohsaki | |
| 2004/0223389 A1* | 11/2004 | Shukuri et al. | 365/202 |

FOREIGN PATENT DOCUMENTS

| | | |
|---|---|---|
| JP | 3-12097 | 1/1991 |
| JP | 5-217384 | 8/1993 |
| JP | 6-334190 | 12/1994 |
| JP | 2002-237578 | 8/2002 |
| JP | 2002-260381 | 9/2002 |
| JP | 2008-235598 | 10/2008 |
| WO | WO 2006/026159 | 3/2006 |

OTHER PUBLICATIONS

Eitan, B. et al., "Can NROM, a 2 Bit, Trapping Storage NVM Cell, Give a Real Challenge to Floating Gate Cells?", Extended Abstracts of the 1999 International Conference on Solid State Devices and Materials, (1999), pp. 522-523.

* cited by examiner

*Primary Examiner* — Kretelia Graham
(74) *Attorney, Agent, or Firm* — Nixon & Vanderhye P.C.

(57) ABSTRACT

A nonvolatile random access memory that can be mounted on a substrate during a standard CMOS process. A memory cell comprises: a first MIS transistor including a first semiconductor layer of a first conductivity type in an electrically floating state, first drain and source regions of a second conductivity type formed on the first semiconductor layer, and a first gate electrode formed over the first semiconductor layer via a first gate insulating film; and a second MIS transistor including a second semiconductor layer of the first conductivity type isolated from the first semiconductor layer, second drain and source regions of the second conductivity type formed on the second semiconductor layer, a second gate electrode formed over the second semiconductor layer via a second gate insulating film. The first and second gate electrodes are electrically connected to each other so as to form a floating gate in an electrically floating state.

20 Claims, 16 Drawing Sheets

| Second MIS Transistor | First MIS Transistor | | | |
|---|---|---|---|---|
| Storage State (Second Storage Mode) | Storage State Before Recall (First Storage Mode) | Impact Ionization | Recall Operation | Storage State After Recall (First Storage Mode) |
| Second Storage State "0" | Second Storage State "0" | Weak | "0" | Second Storage State "0" |
| First Storage State "1" | Second Storage State "0" | Strong | "0" ⇒ "1" | First Storage State "1" |

Fig. 7

| Case | First MIS Transistor | | Second MIS Transistor | First MIS Transistor | | Second MIS Transistor | |
|---|---|---|---|---|---|---|---|
| | Storage State (First Storage Mode) | Vth | Storage State Before Storing (Second Storage Mode) | First Storing Process | Second Storing Process | First Storing Process | Second Storing Process | Storage State After Storing (Second Storage Mode) |
| 1 | First Storage State "1" | Low | First Storage State "1" | Inversion | Inversion | "1" ⇒ "0" | "0" | "0" |
| 2 | Second Storage State "0" | High | First Storage State "1" | Noninversion | Inversion | "1" | "1" | "1" |
| 3 | First Storage State "1" | Low | Second Storage State "0" | Noninversion | Inversion | "0" | "0" | "0" |
| 4 | Second Storage State "0" | High | Second Storage State "0" | Noninversion | Noninversion | "0" | "0" ⇒ "1" | "1" |

Fig. 11

NONVOLATILE RANDOM ACCESS MEMORY

CROSS-REFERENCE TO RELATED APPLICATIONS

This application is the U.S. national phase of International Application No. PCT/JP2009/050013 filed 6 Jan. 2009, which designated the U.S. and claims priority to Japan Application No. 2008-009746 filed 18 Jan. 2008, the entire contents of each of which are hereby incorporated by reference.

TECHNICAL FIELD

The present invention relates to a nonvolatile random access memory, and in particular, to a nonvolatile random access memory that can be mounted on a substrate during a standard CMOS process, where data can be electrically written, so that the written data can be stored in a volatile or nonvolatile state.

BACKGROUND ART

Nonvolatile semiconductor memory devices where data can be electrically written and written data can be stored in a nonvolatile state have such properties that stored data can be stored without being lost even when the power is turned off, but generally are limited in terms of how many times data can be written, as well as the rate of writing (approximately 10 ms or less), and therefore are not appropriate for applications where data is written frequently. Such nonvolatile semiconductor memory devices include EEPROM's (electrically erasable and programmable read only memories) and flash memories. Meanwhile, volatile semiconductor memory devices where data can be electrically written and written data can be stored in a volatile state lose stored data when the power is turned off, but are not limited in terms of how many times data can be written, and have a very high rate of writing in comparison with nonvolatile semiconductor memory devices (100 ns or less). Typical nonvolatile semiconductor memory devices include DRAM's (dynamic random access memories) and SRAM's (static random access memories).

Thus, nonvolatile random access memories (NVRAM's) where the memory cell structure of the volatile semiconductor memory device and the memory cell structure of the nonvolatile semiconductor memory device are integrated so that it is possible to write data at a high rate, which is a good point in volatile semiconductor memory devices, as well as to store data even when the power is turned off, as in nonvolatile semiconductor memory devices, have been developed (see for example the following Patent Documents 1 and 2).

Patent Document 1 discloses a nonvolatile dynamic random access memory (NVDRAM) having memory cells where a DRAM cell and an EEPROM cell are combined. As shown in the equivalent circuit diagram of FIG. 13, the memory cell disclosed in Patent Document 1 has such a structure that one of the drain and source of the transistor Q11 that becomes a transfer gate of the DRAM cell is connected to a bit line BL, the other is connected to one of the drain and source of the second MIS transistor Q12, the gate of the transistor Q11 is connected to a word line WL, the other of the drain and source of the second MIS transistor Q12 is connected to one of the drain and source of the transistor Q13 for preventing the second MIS transistor Q12 from interfering with the operation of the DRAM, the gate of the second MIS transistor Q12 is connected to a writing control line GL, the other of the drain and source of the transistor Q13 is connected to a control line SL, the gate of the transistor Q13 is connected to a switching control line TL, one end of a capacitor element Cs is connected to the connection point between the other of the drain and source of the transistor Q11 and one of the drain and source of the second MIS transistor Q12, and the other end is grounded.

Patent Document 2 discloses a nonvolatile static random access memory (NVSRAM) having memory cells where an SRAM cell and an EEPROM cell are combined. As shown in the equivalent circuit diagram of FIG. 14, the memory cell disclosed in Patent Document 2 has such a structure that EEPROM cells Q20 and Q21 are connected to a pair of complementary data storage nodes DN and DNB in a resistive load SRAM cell, respectively, via selection transistors Q22 and Q23.

Next, nonvolatile semiconductor memory devices that can be mounted on a substrate during a standard CMOS process include the nonvolatile semiconductor memory device disclosed in the following Patent Document 3. The structure of the nonvolatile semiconductor memory device disclosed in Patent Document 1 is described below in reference to FIG. 15. FIG. 15A is a schematic cross sectional diagram showing a memory cell used in the nonvolatile semiconductor memory device in Patent Document 1, and FIG. 15B is an equivalent circuit diagram thereof.

In the memory cell 100 in FIG. 15A, an N type well 102 is formed on a P type semiconductor substrate 101 and P type impurity diffusion layers 110 and 111, as well as an N+ type impurity diffusion layer 112, are formed on the well 102. In addition, the P type impurity diffusion layer 111 and the N+ type impurity diffusion layer 112 are isolated from each other by an element isolation insulating film 114. In addition, separate N type impurity diffusion layers 108 and 109 are formed within the region on the semiconductor substrate 101 where there is no N type well 102 (hereinafter referred to as "region outside well"). In addition, the N type impurity diffusion layer 109 and the P type impurity diffusion layer 110 formed on the N type well 102 are isolated from each other by an element isolation insulating film 113.

Thus, a first gate electrode 106 is formed through a first gate insulating film 104 over the region outside the well so as to overlap with the region between the N type impurity diffusion layers 108 and 109. Meanwhile, a second gate electrode 105 is formed through a second gate insulating film 103 over the N type well 102 region so as to overlap with the region between the P type impurity diffusion layers 110 and 111. Here, the first gate electrode 106 and the second gate electrode 105 are electrically connected through a conductor 107.

In addition, the memory cell 100 is provided with a contact C101 for electrical connection to the N type impurity diffusion layer 108, a contact C102 for electrical connection to the N type impurity diffusion layer 109, and a contact C103 for collective electrical connection to the P type impurity diffusion layers 110 and 111 and the N+ type impurity diffusion layer 112. As shown in FIG. 15A, the P type impurity diffusion layers 110 and 111 and the N+ type impurity diffusion layer 112 are all connected to the same node, so that the structure allows the same voltage to be applied to all of the impurity diffusion layers 110, 111 and 112 when a predetermined voltage is applied to the contact C103.

The nonvolatile semiconductor memory device disclosed in Patent Document 3 is formed of a memory cell array where a number of memory cells 100 having the above described structure are aligned in rows and columns. At this time, memory cells having a predetermined positional relationship are electrically connected to each other through the same bit line, word line or source line. In the following, the contact C101, the contact C102 and the contact C103 are connected to a bit line, a source line and a word line, respectively.

The memory cell 100 in FIG. 15A is provided with a MOS transistor Q30 formed of the P type semiconductor substrate 101, the N type impurity diffusion layer 108, the N type impurity diffusion layer 109, the first gate insulating film 104 and the first gate electrode 106, and a MOS capacitor Q31 formed of the N type well 102, the P type impurity diffusion layer 110, the P type impurity diffusion layer 111, the second gate insulating film 103 and the second gate electrode 105. In addition, the first gate electrode 106 that forms the MOS transistor Q30 and the second gate electrode 105 that forms the MOS capacitor Q31 are connected through the conductor 107, while the first gate electrode 106 is electrically insulated from the semiconductor substrate 101, as well as from the N type impurity diffusion layers 108 and 109, by the first gate insulating film 104, and the second gate electrode 105 is electrically insulated from the N type well 102, as well as from the P type impurity diffusion layers 110 and 111, by the first gate insulating film 103, so that the first gate electrode 106 and the second gate electrode 105 (as well as the conductor 107 which electrically connects these) form a floating gate electrode FG (see FIG. 15B).

In a thus formed memory cell 100, it is assumed that a predetermined first positive voltage is applied to the N type impurity diffusion layer 108 through the contact C101, a ground voltage is applied to the N type impurity diffusion layer 109 through the contact C102, and a predetermined second positive voltage which is higher than the first positive voltage is applied to the P type impurity diffusion layer 110 and 111 and the N+ type impurity diffusion layer 112 through the contact C103 (hereinafter this state in which the voltages are applied is referred to as first voltage state). If the second positive voltage has a voltage value that is sufficiently high relative to the potential at which the second gate electrode 105 is charged, in other words, if the potential of the second gate electrode 105 is sufficiently low relative to the potential of the N type well 102 and the P type impurity diffusion layers 110 and 111, an inversion layer (hereinafter referred to as capacitor side inversion layer) is formed in the interface between the N type well 102 beneath the second gate electrode 105 and the second gate insulating film 103. At this time, holes that are minority carriers in the capacitor side inversion layer are supplied from the adjacent P type impurity diffusion layers 110 and 111, and therefore, the potential of the capacitor side inversion layer is coupled to the second positive voltage.

Incidentally, the capacitance between the capacitor side inversion layer and the second gate electrode 105 depends on the size and materials. Meanwhile, in the case where the potential of the first gate electrode is sufficiently high in the positive direction relative to the semiconductor substrate 101 in the portion where the first gate electrode 106 and the semiconductor substrate 101 overlap in the first gate electrode 106 that is electrically connected to the second gate electrode 105, an inversion layer (hereinafter referred to as transistor side inversion layer) is formed in the interface between the semiconductor substrate 101 located beneath the first gate electrode 106 and the first gate insulating film 104, and the capacitance between the transistor side inversion layer and the first gate electrode 106 depends on the size and materials.

In the case where the potential of the semiconductor substrate 101 is the ground potential in the above described first voltage state, there is a difference in potential that is the same as the second positive voltage between the semiconductor substrate 101 and the capacitor side inversion layer. The second gate electrode 105 and the first gate electrode 106 are electrically connected and at the same potential, and therefore, the second gate electrode 105 and the first gate electrode 106 (that is to say, the floating gate electrode FG) are at a predetermined positive potential that is determined by the capacitance vis-à-vis the capacitor side inversion layer, and the capacitance vis-à-vis the transistor side inversion layer (a higher potential).

At this time, the potential of the first gate electrode 106 is higher than the semiconductor substrate 101, and therefore, in the case where this difference in potential is sufficiently high, a transistor side inversion layer is formed in the interface between the portion where the first gate electrode 106 and the semiconductor substrate 101 overlap and the first gate insulating film 6, as described above. In the above described first voltage state, the first positive voltage is applied to the N type impurity diffusion layer 108 through the contact C101 and the ground voltage is applied to the N type impurity diffusion layer 109 through the contact C102, and thus, a positive electrical field is generated toward the N type impurity diffusion layer 108 from the N type impurity diffusion layer 109 and electrons within the N type impurity diffusion layer 109 accelerate under the influence of this positive electrical field so as to become of a hot electron state. These hot electrons are attracted to the first gate electrode 106 in a high voltage state and thus injected into the floating gate electrode FG. As a result, the floating gate electrode FG is charged negative.

In the MOS transistor Q30, the voltage value to be applied to the N type well 102 through the contact C103 for forming the transistor side inversion layer varies depending on the amount of electrons stored in the floating gate electrode FG. That is to say, in the case where a predetermined third positive voltage is applied through the contact C103 and a predetermined fourth positive voltage is applied to the N+ impurity diffusion layer 108 through the contact C101, if the MOS transistor Q30 becomes of a conductive state with a transistor side inversion layer present, this means that a sufficient amount of electrons are not stored in the floating gate electrode FG; conversely, if the MOS transistor Q30 is in a non-conductive state without there being a transistors side inversion layer, this means that a sufficient amount of electrons are stored in the floating gate electrode FG. Usually data is programmed, in the state where a sufficient amount of electrons are stored in the floating gate electrode FG, which is thus charged negative, and data is not programmed, in the other state.

That is to say, the above described fourth positive voltage is applied to the N type impurity diffusion layer 108 through the contact C101, the ground voltage is applied to the N type impurity diffusion layer 109 through the contact C102, and the above described third positive voltage is applied to all of the P type impurity diffusion layers 110 and 111 and the N+ type impurity diffusion layer 112 through the contact C103 (hereinafter this state in which the voltages are applied is referred to as second voltage state), so that it can be determined whether or not the current flowing through the bit line connected to the contact C101 or the current flowing through the source line connected to the contact C102 is detectable, and the results of the determination are matched with the two values: "0" and "1," and thus, a readout process for two-value data stored in the memory cell 100 is carried out.

Thus, the memory cell 100 becomes of the above described first voltage state so that a data programming process is carried out, and becomes of the above described second voltage state so that a data readout process is carried out. Here, the floating gate electrode FG, which is charged negative when hot electrons are injected through the programming process, is peripherally isolated by the insulating film (the first gate insulating film 103 and the second gate insulating film 104), and therefore the charge is not volatile, so that the structure makes it possible to maintain the charged state for a long period of time. In addition, a programming process or readout process is selected for a memory cell 100, depending on the voltage applied through the contact C103, and therefore, the P type impurity diffusion layers 110 and 111 and the N+ type impurity diffusion layer 112, to which a voltage is applied through the contact C103 in the memory cell 100, correspond to the control gate electrode CG in EEPROM cells with a floating gate structure.

Next, a case where the data stored in the memory cell 100 in a programmed state in which the floating gate electrode FG is charged negative is erased is described.

In the case of an erasing operation, a ground voltage is applied to the P type impurity diffusion layers 110 and 111 and the N+ type impurity diffusion layer 112 through the contact C103, so that a predetermined fifth positive voltage (approximately the same as the first positive voltage or higher) is applied to the N type impurity diffusion layer 108 through the contact C101, and the contact C102 becomes of a floating state (with a high impedance) (hereinafter this state in which the voltages are applied is referred to as "third voltage state"). At this time, there is a difference in potential between the floating gate electrode FG (first gate electrode 106) and the N type impurity diffusion layer 108, so that a strong electrical field is generated, and the electrons stored within the floating gate electrode FG are drawn out to the N type impurity diffusion layer 108 side as a result of the FN (Fowler-Nordheim) tunneling phenomenon, and the programming state changes. In this case, the above descried fifth positive voltage may be applied to the N type impurity diffusion layer 109 through the contact C102 as well, so that a strong electrical filed is generated from the floating gate electrode FG to the facing surface of the semiconductor substrate 101, and thus, electrons can be drawn out using this electrical field.

Non-Patent Document 1 discloses a method for injecting hot holes into the floating gate electrode FG as another erasing method. The erasing method disclosed in Non-Patent Document 1 can be applied in the memory cell 100 in FIG. 15 in the following manner. That is to say, a ground voltage or negative voltage is applied to the control gate electrode CG, and at the same time, a predetermined positive voltage is applied to the N type impurity diffusion layer 108 through the contact C101. At this time, there is a large difference in potential between the N type impurity diffusion layer 108 and the control gate electrode CG, which have opposite polarities, and as a result, the surface of the N type impurity diffusion layer 108 becomes of a deep depletion state, making the energy band curve steeply. At this time, electrons tunnel from a valence band to a conduction band through band-band tunneling. At this time, electrons-hole pairs are generated, and the electrons flow into and are absorbed by the N type impurity diffusion layer 108, while the generated holes accelerate in the horizontal direction as a result of the electrical field in the horizontal direction between the N type impurity diffusion layer 108 and the semiconductor substrate 101 (with the semiconductor substrate 101 at the ground potential) so as to become hot holes, which are attracted to the first gate electrode 106, which is in a positive voltage state, or close to the ground voltage, and as a result they are injected into the floating gate FG (band-band tunneling induced hot hole injection). The injected hot holes offset electrons stored within the floating gate electrode FG so as to change the negatively charged state, and thus information is erased.

Here, though the method for applying a voltage is similar between the above described erasing method using the FN tunneling phenomenon and the erasing method using hot hole injection, the two are different in that it is essential that an ultra-thin gate insulating film be used in order to enhance the internal electrical field in the insulating film enough to cause the tunneling phenomenon when the voltage is within a practical range according to the former, while it is not necessary to use an ultra-thin gate insulating film according to the latter.

In addition to nonvolatile semiconductor memory devices that can be mounted on a substrate during a standard CMOS process, a DRAM (volatile semiconductor memory device) where data can be electrically written, which can be mounted on a substrate without adding any new steps to the standard CMOS process, is disclosed in the following Patent Document 4. The structure of the DRAM disclosed in Patent Document 4 is described below in reference to FIG. 16. FIG. 16A is a schematic cross sectional diagram showing the memory cell 200 used in the DRAM disclosed in Patent Document 4, and FIG. 16B is an equivalent circuit diagram showing a memory cell array.

The memory cell 200 is formed of an N channel type MIS transistor having an SOI structure (insulating gate type field effect transistor). That is to say, an SOI substrate where a silicon oxide film 202 is formed on a silicon substrate 201 as an insulating film and a P type silicon layer 203 is formed on the silicon oxide film 202 is used for the memory cell 200. A gate electrode 205 is formed through a gate oxide film 204 over the P type silicon layer 203 in the SOI substrate, and n type source and drain diffusion layers 206 and 207 are self-aligned with the gate electrode 205.

A number of memory cells 200 are aligned in rows and columns, so that a memory cell array where the gates 205 of the memory cells 200 aligned in rows are connected to word lines WL, the drains 207 of the memory cells 200 aligned in columns are connected to bit lines BL, and the sources 206 of the memory cells 200 are connected to ground lines is formed. In each memory cell 200, a first data state in which a first threshold voltage is provided when excessive majority carriers are stored in the P type silicon layer 203, and a second data state in which a second threshold voltage is provided when the excessive majority carriers are released from the P type silicon layer 203 are held dynamically, and data can be written in any bit unit, and furthermore, an initialization mode where all of the memory cells 200 in the memory cell array are programmed into in the first data state is provided.

The n type source and drain diffusion layers 206 and 207 are formed so deep as to hit the silicon oxide film 202 below. Accordingly, the body region made of the P type silicon layer 203 is isolated from the sides and bottom so as to become of a floating state.

The principle behind how a DRAM made up of N channel type MIS transistors operates is explained below. Storage of holes, which are majority carriers in the body region of the MIS transistors, is used to store data. That is to say, the MIS transistors operate in a pentode region, so that impact ions are generated in the vicinity of the drain 207. Holes which are excessive majority carriers generated through impact ionization are held in the P type silicon layer 203, and the state in which holes are stored corresponds to data "1," for example. The PN junction between the drain diffusion layer 207 and the P type silicon layer 203 can be biased in the forward direction so that excessive holes in the P type silicon layer 203 are released to the drain side, of which the state corresponds to data "0."

The data "0" or "1" is stored as a difference in the state of holes stored within the body region (that is to say, the difference in potential) and as a difference in the threshold voltage of the MIS transistor. That is to say, the threshold voltage Vth1 in the data "1" state, in which the potential in the body region is high due to holes being stored, is lower than the threshold voltage Vth0 in the data "0" state. In order to hold the data "1" state, in which holes which are majority carriers are stored in the body region, it is necessary to apply a negative voltage to the word line. This state in which data is stored does not change, even when a readout operation is carried out, unless an operation for writing in the opposite data (an erasing operation) is carried out. That is to say, nondestructive readout is possible.

Data readout methods include methods for detecting difference in the current for driving a memory cell having two storage states by applying a voltage between the threshold voltage Vth0 and Vth1 in the above described two storage states or a voltage that is not lower than the two threshold voltages to the word line. Methods for detecting difference in the current for driving include methods for driving a word line after pre-charging a bit line to a predetermined potential and checking the fall in the potential of the bit line at that time, methods for increasing the potential of a bit line after pre-charging a word line and checking the rate of increase in the potential of the bit line, and methods for increasing the potential of a word line after the potential of a bit line is clamped to a predetermined potential and checking the difference in the bit line current between memory cells in different states.

Patent Document 1: Japanese Unexamined Patent Application Publication No. 3-12097

Patent Document 2: U.S. Pat. No. 5,065,362

Patent Document 3: Japanese Unexamined Patent Application Publication No. 6-334190

Patent Document 4: Japanese Unexamined Patent Application Publication 2002-260381

Non-Patent Document 1: Boaz Eitan et al., "Can NROM, a 2 Bit, Trapping Storage NVM Cell, Give a real Challenge to Floating Gate Cells?" Extended Abstracts of the 1999 International Conference on Solid State Devices and Materials, Tokyo, 1999, p. 522-523

DISCLOSURE OF THE INVENTION

Problems to be Solved by the Invention

The conventional nonvolatile random access memory disclosed in Patent Document 1 requires additional manufacturing steps in the logic process (CMOS process) in order to manufacture DRAM cells having a sufficiently small capacitor area, and the manufacturing cost is high. Meanwhile, though the conventional nonvolatile random access memory disclosed in Patent document 2 can be manufactured only from transistors in a standard logic process when the EEPROM's are replaced with a single layer polysilicon type element structure (see FIG. 15), the number of elements in the SRAM cell portion is great and take up a large area of the memory cells.

In addition, in both of these nonvolatile random access memories, the drain or source of the nonvolatile memory cell elements is connected to the charge storage node in the volatile memory cell portions, and therefore, it is necessary to add a switch element between the nonvolatile memory cell element and the volatile memory cell element, in order to prevent the EEPROM cells from interfering with the memory storing voltage in the volatile memory cell portions when the volatile memory cells operate, which causes the memory cell area to increase.

Furthermore, the above described conventional nonvolatile random access memories disclosed in Patent Documents 1 and 2 adopt MNOS type or MONOS type nonvolatile memory cell elements, which use a nitride silicon film as a charge storing layer, and it is necessary to add manufacturing steps for a nitride silicon film in the standard logic process for the nonvolatile memory cell elements. In the case where EEPROM cells are used as nonvolatile memory cells and combined with volatile memory cells, it is necessary to adopt one-layer polysilicon type nonvolatile memory cells in order to integrate volatile memory cells and nonvolatile memory cells without changing the standard logic process. However, as described above (see FIG. 15), it is necessary to add a control gate capacitor for controlling a floating gate, as well as a memory cell MIS transistor, in the memory cells.

As described above, in the technology for conventional nonvolatile random access memories, it is necessary to add a switching element in a portion for connecting the drain or source of a nonvolatile memory cell element to the charge storage node of a volatile memory cell, and furthermore, in the case where nonvolatile memory cell elements are added without changing the standard logic process, a problem arises, such that the nonvolatile memory cell elements cannot be formed of one transistor. Furthermore, the combined nonvolatile memory cells make the manufacturing process more complex by adding a new process or increasing the number of unit elements (for example transistors) for forming volatile memory cells, and thus, it is difficult to form a nonvolatile random access memory where the memory cell structure of volatile semiconductor memory devices and the memory cell structure of nonvolatile semiconductor memory devices are integrated without adding a new process or increasing the number of unit elements for forming memory cells. Accordingly, it is difficult to form a nonvolatile random access memory where memory cells made up of two transistors having a minimal number of nonvolatile memory cells and volatile memory cells can be mounted on a substrate during a standard CMOS process simply by combining prior arts.

The present invention is provided in view of the above described problems, and an object of the invention is to provide a nonvolatile random access memory that can be mounted on a substrate during a standard CMOS process.

Means for Solving the Problem

In order to achieve the above described object, the nonvolatile random access memory according to the present invention is a nonvolatile random access memory having nonvolatile memory cells that can store one-bit data, wherein the memory cell comprises: a first MIS transistor formed of a first semiconductor layer of a first conductivity type which is in an electrically floating state, a first drain region and a first source region made of an impurity diffusion region of a second conductivity type that is opposite to the first conductivity type formed on a surface of the first semiconductor layer, and a first gate electrode formed through a first gate insulating film over the surface of the first semiconductor layer between the first drain region and the first source region; and a second MIS transistor formed of a second semiconductor layer of the first conductivity type that is isolated from the first semiconductor layer, a second drain region and a second source region made of an impurity diffusion region of the second conductivity type formed on a surface of the second semiconductor layer, a second gate electrode formed through a second gate insulating film over the surface of the second semiconductor layer between the second drain region and the second source region, and having a first characteristic such that the first gate electrode and the second gate electrode are electrically connected to each other so as to form a floating gate in an electrically floating state, one-bit data is stored in a volatile manner by controlling the threshold voltage of the first MIS transistor in accordance with the amount of charge in the first semiconductor layer in a first storage mode, and one-bit data is stored in a nonvolatile manner by controlling the threshold voltage of the second MIS transistor in accordance with the amount of charge in the floating gate in a second storage mode.

According to the above described first characterized nonvolatile random access memory, the memory cells of the nonvolatile random access memory are formed of two transistors, a first MIS transistor that functions as a transistor for a volatile memory cell and a second MIS transistor that functions as a transistor for a nonvolatile memory cell, and in addition, the memory cells can be mounted on a substrate during a standard CMOS process.

Here, the voltage of the first gate electrode of the first MIS transistor can be controlled from the terminal on the second MIS transistor side through the capacitance coupling between the second semiconductor layer and the second gate electrode of the second MIS transistor, and in contrast, the voltage of the second gate electrode of the second MIS transistor can be controlled from the terminal on the first MIS transistor side through the capacitance coupling between the first semiconductor layer and the first gate electrode of the first MIS transistor. That is to say, though the first MIS transistor does not completely function as a volatile memory cell by itself and the second MIS transistor does not completely function as a nonvolatile memory cell by itself, the structure allows the second MIS transistor to be controlled from the first MIS transistor side and the first MIS transistor to be controlled from the second MIS transistor side through the capacitance coupling between the first semiconductor layer and the first gate electrode and between the second semiconductor layer and the second gate electrode, respectively, and therefore, the volatile storage state in the first storage mode and the nonvolatile storage state in the second storage mode can be respectively controlled using the two transistors.

In addition, the first semiconductor layer is in an electrically floating state, and therefore, the capacitance coupling state between the first semiconductor layer and the first gate electrode depends on the state in which a charge is stored in the first semiconductor layer, that is to say, the storage state in the first storage mode, and therefore, it is possible to change the programming of data through control of the voltage of the second gate electrode in the second MIS transistor on the basis of the storage state in the first storage mode, and thus, it is possible to make the volatile storage state in the first storage mode and the nonvolatile storage state in the second storage mode associate with each other. Furthermore, the first semiconductor layer and the second semiconductor layer are insulated from each other in such a manner that no charge moves between the two semiconductor layers, and the amount of charge stored in the semiconductor layer of one MIS transistor does not increase or decrease because no charge passes through the other MIS transistor when it is driven. That is to say, the memory cells having the above described characteristics have a structure where no switching element is necessary in order to prevent interference between the two MIS transistors.

Though the memory cells of the nonvolatile random access memory having the above described characteristics have a similar structure as that of the memory cells of the nonvolatile semiconductor memory device that can be mounted on a substrate during a standard CMOS process as disclosed in Patent Document 3 in that they are provided with two MIS transistors (see FIG. 15). However, in the memory cells having the above described characteristics, the conductivity type of the two MIS transistors is the same, and the first semiconductor layer in the first MIS transistor is in an electrically floating state, while in the memory cells disclosed in Patent Document 3, the conductivity is different between the MOS transistor and the transistor forming the MOS capacitor, and the semiconductor layer (body region) in the transistor forming the MOS capacitor is not in an electrically floating state, and in addition, forms a PN junction with the semiconductor layer in the transistor forming the MOS transistor, and thus, the memory cells are greatly different.

Furthermore, though the first MIS transistor in the memory cells having the above described characteristics has a similar structure as that of the memory cells in the volatile semiconductor memory device that can be mounted on a substrate during a standard CMOS process as disclosed in Patent Document 4 (see FIG. 16), the first gate electrode of the first MIS transistor and the second gate electrode of the second MIS transistor are electrically connected to each other so that a floating gate in an electrically floating state is formed in the memory cells having the above described characteristics, and thus, the memory cells are greatly different.

Accordingly, though the memory cells having the above described characteristics have some similarities to the memory cells of the nonvolatile semiconductor memory device as disclosed in Patent Document 3 and of the volatile semiconductor memory device disclosed in Patent Document 4 that can be mounted on a substrate during a standard CMOS process, the memory cells cannot be gained by simply integrating these memories, but are gained by forming the first and second MIS transistors without providing a switching element for preventing interference between two memory cells so that the first gate electrode and the second gate electrode are electrically connected to each other so as to form a floating gate in an electrically floating state, and thus, are characterized in that the nonvolatile memory cells disclosed in Patent Document 3 and the volatile memory cells disclosed in Patent Document 4 are integrated in such a manner that the functions of these memory cells can be performed.

Furthermore, the nonvolatile random access memory according to the present invention has a second characteristic such that the nonvolatile random access memory further comprises a contact region for supplying a voltage to the second semiconductor layer made of an impurity diffusion region of the first conductivity type on the surface of the second semiconductor layer, wherein the contact region and the second source region are electrically connected so as to have the same potential.

According to the above described nonvolatile random access memory having the second characteristic, the potential of the second semiconductor layer, which is the potential of the substrate of the second MIS transistor that is used for reading out and writing the nonvolatile storage state in the second storage mode, can be controlled simultaneously with the potential of the second source region, and at the same time, the current flowing through the substrate at the time of writing can be effectively eliminated.

Furthermore, the nonvolatile random access memory according to the present invention has a third characteristic such that the nonvolatile random access memory further comprises a first data writing circuit arranged to write a storage state in the first storage mode, wherein the first data writing circuit applies a positive first programming voltage to the first drain region with the first source region as a reference when the first conductivity type is a P type, and a negative first programming voltage when the first conductivity type is an N type, and applies a second programming voltage of the same polarity as the first programming voltage to at least any one of the second drain region, the second source region and the second semiconductor layer in order to control a voltage of the first gate electrode through capacitance coupling between the second gate and at least any one of the second drain region, the second source region and the second semiconductor layer, so that impact ions are generated in the vicinity of the first drain region, a positive charge is stored within the first semiconductor layer when the first conductivity is the P type, and a negative charge is stored within the first semiconductor layer when the first conductivity type is the N type, and the storage state in the first storage mode is changed to a first storage state, and the first data writing circuit applies a third programming voltage having a polarity opposite to that of the first programming voltage to the first drain region with the first source region as a reference, so that the junction between the first drain region and the first semiconductor layer becomes of a forward direction bias state, the charge stored in the first semiconductor layer is released to the first drain region, and the storage state in the first storage mode is changed to a second storage state.

According to the above described nonvolatile random access memory having the third characteristic, the first data writing circuit allows the first MIS transistor that is used for writing the volatile storage state in the first storage mode to be controlled from the second MIS transistor side so that the first storage state is programmed, and the voltage applied to the first drain region of the first MIS transistor is controlled, thus making it possible for the first storage state to be programmed, and thus, writing of two value data in the first storage mode can be carried out.

Furthermore, the nonvolatile random access memory according to the present invention has a fourth characteristic such that the nonvolatile random access memory further comprises a first data readout circuit arranged to read out the storage state in the first storage mode, wherein the first data readout circuit applies a positive first readout voltage to the first drain region with the first source region as a reference when the first conductivity type is the P type, and a negative first readout voltage when the first conductivity type is the N type, and applies a second readout voltage of the same polarity as the first readout voltage to at least any one of the second drain region, the second source region and the second semiconductor layer in order to control the voltage of the first gate electrode through capacitance coupling between the second gate and at least any one of the second drain region, the second source region and the second semiconductor layer, so that the difference in the threshold voltage of the first MIS transistor determined in accordance with the amount of charge in the first semiconductor layer is detected as the difference in current between the first drain region and the first source region, and it is detected whether the storage state in the first storage mode is the first storage state or the second storage state.

According to the above described nonvolatile random access memory having the fourth characteristic, the first data readout circuit allows the first MIS transistor that is used for reading out the volatile storage state in the first storage mode to be controlled from the second MIS transistor side so that the first storage state is read out, and thus, two value data in the first storage mode can be read out.

Furthermore, the nonvolatile random access memory according to the present invention has a fifth characteristic such that the nonvolatile random access memory further comprises a recall circuit arranged to carry out a recall process in which the storage state in the second storage mode is transferred to the storage state in the first storage mode, wherein the recall circuit applies a positive first recall voltage to the first drain region with the first source region as a reference when the first conductivity type is the P type and a negative first recall voltage when the first conductivity type is the N type, and applies a second recall voltage of the same polarity as the first recall voltage to at least any one of the second drain region, the second source region and the second semiconductor layer in order to control the voltage of the first gate electrode through capacitance coupling between the second gate and at least any one of the second drain region, the second source region and the second semiconductor layer, so that generation of impact ions in the vicinity of the first drain region is controlled in response to change in the voltage of the first gate electrode in accordance with the storage state in the second storage mode, and the storage state of the second storage mode is transferred to the storage state of the first storage mode which depends on the amount of charge in the first semiconductor layer.

According to the above described nonvolatile random access memory having the fifth characteristic, the potential of the first gate electrode in the first MIS transistor that is used for writing the volatile storage state in the first storage mode changes in accordance with the amount of charge stored in the floating gate for the nonvolatile storage state in the second storage mode, and therefore, the channel current flowing through the first MIS transistor during a recall process changes so that there is a difference in the amount of impact ions generated in the vicinity of the drain region. As a result, it becomes possible to change the amount of charge in the first semiconductor layer which corresponds to the body region of the first MIS transistor during a certain period of time in accordance with the storage state in the second storage mode so that the storage state in the first storage mode can be converted from the second storage state to the first storage state.

Furthermore, the nonvolatile random access memory according to the present invention has a sixth characteristic such that the recall circuit carries out an initialization process by applying a third recall voltage having a polarity opposite to that of the first recall voltage to the first drain region with the first source region as a reference before applying the first recall voltage and the second recall voltage so that the junction between the first drain region and the first semiconductor layer becomes of a forward direction bias state, the charge stored in the first semiconductor layer is released to the first drain region, and the storage state is changed to the second storage state.

According to the above described nonvolatile random access memory having the sixth characteristic, the storage state in the first storage mode changes from the first storage state to the second storage state through the initialization process, and therefore, the storage state in the first storage mode can be made into the second storage state depending on the storage state in the second storage mode in the recall process through the application of the first and second recall voltages in the case where the storage state in the first storage mode is not converted from the second storage state to the first storage state.

Furthermore, the nonvolatile random access memory according to the present invention has a seventh characteristic such that the nonvolatile random access memory further comprises a first storing circuit arranged to carry out a first storing process in which the first storage state in the first storage mode is transferred to the storage state in the second storage mode, wherein, when the storage state in the first storage mode is the first storage state, the first storing circuit applies: a positive first storing voltage to at least the first drain region or the first source region when the first conductivity type is the P type and a negative first storing voltage when the first conductivity type is the N type so that an inversion layer is generated beneath the first gate; a second storing voltage of the same polarity as the first storing voltage to the second drain region; and a third storing voltage of the same polarity as the first storing voltage to the second source region and the second semiconductor layer, in order to control the voltage of the second gate electrode through the capacitance coupling between the first gate electrode and at least the first drain region or the first source region together with the inversion layer, so that hot carriers are generated in either the second drain region or the second source region, a charge having the polarity opposite to that of the charge stored in the first semiconductor layer is injected into the floating gate, and the first storage state in the first storage mode is transferred to the storage state in the second storage mode.

Furthermore, the nonvolatile random access memory according to the present invention has an eighth characteristic such that the nonvolatile random access memory further comprises a second storing circuit arranged to carry out a second storing process in which the second storage state in the first storage mode is transferred to the storage state in the second storage mode, wherein, when the storage state in the first storage mode is the second storage state, the second storing circuit applies: a fourth storing voltage having the same polarity as the first storing voltage to at least the first drain region or the first source region so that no inversion layer is generated beneath the first gate; a fifth storing voltage having the same polarity as the fourth storing voltage to the second drain region; and a sixth storing voltage having the same polarity as the fourth storing voltage to the second source region and the second semiconductor layer, in order to control the voltage of the second gate electrode through the capacitance coupling between the first gate and at least the first drain region or the first source region, so that hot carriers having the polarity opposite to that of the hot carriers in the first storing process are generated in either the second drain region or the second source region, a charge having the same polarity as the charge stored in the first semiconductor layer is injected into the floating gate, and the second storage state in the first storage mode is transferred to the storage state in the second storage mode.

According to the above described nonvolatile random access memory having the seventh or eighth characteristic, the first storing process in the first storing circuit can allow the first storage state in the first storage mode to be transferred to the storage state in the second storage mode, and the second storing process in the second storing circuit can allow the second storage state in the first storage mode to be transferred to the storage state in the second storage mode for the memory cells where the nonvolatile storage state in the second storage mode and the volatile storage state in the first storage mode are different.

In particular, according to the nonvolatile random access memory having the seventh characteristic, in the case where the storage state in the second storage mode is a state where a small amount of charge (the amount of charge is stored as a negative charge in the case where the first conductivity type is the P type and as a positive charge in the case where it is the N type) is stored in the second gate electrode (floating gate) in the second MIS transistor and the storage state in the first storage mode is a first storage state where the charge (positive charge in the case where the first conductivity type is the P type and negative charge in the case where it is the N type) is stored in the first semiconductor layer of the first MIS transistor, the difference in the voltage between the first gate electrode of the first MIS transistor and the first semiconductor layer is sufficiently higher than the threshold voltage of the first MIS transistor so that an inversion layer is formed in the region beneath the first gate electrode on the surface of the first semiconductor layer, and the first storing voltage applied to at least the first drain region or the first source region crosses the inversion layer and causes capacitance coupling with the first gate electrode via the first gate insulating film, and thus, changes the voltage of the second gate electrode, turning on the second MIS transistor so that a current flows across the second drain region and the second source region, and hot carriers are generated in either the second drain region or the second source region so as to be injected into the second gate electrode, and thus, the first storage state in the first storage mode can be transferred to the storage state in the second storage mode.

Here, it is necessary for the difference in the voltage between the second storing voltage and the third storing voltage to be a predetermined high voltage in order for the second MIS transistor to be turned on so that a sufficient current for generating hot carriers flows across the second drain region and the second source region. In addition, it is sufficient for a high voltage to be applied across the second drain region and the second source region, and either the second storing voltage or the third storing voltage may be a ground voltage (0 V).

Here, in the case where the storage state in the first storage mode is the second storage state in which no charge is stored in the first semiconductor layer of the first MIS transistor or the storage state in the second storage mode is such a state that charge is stored in the second gate electrode (floating gate) of the second MIS transistor, the threshold voltage of the first MIS transistor is high or the voltage of the first gate electrode is low, and therefore, the difference in the voltage between the voltage of the first gate electrode of the first MIS transistor and the voltage of the first semiconductor layer is lower than the threshold voltage of the first MIS transistor so that no inversion layer is formed in the region on the surface of the first semiconductor layer beneath the first gate electrode, and thus, the first storing voltage applied to at least either the first drain region or the first source region of the first MIS transistor does not cross the inversion layer and cause no capacitance coupling with the first gate electrode via the first gate insulating film, and therefore, no hot carriers are generated in the second MIS transistor nor are injected into the second gate electrode.

In particular, according to the nonvolatile random access memory having the eighth characteristic, the sixth storing voltage is set such that, in the case where the storage state in the second storage mode is such a state that a charge (a negative charge in the case where the first conductivity type is the P type and a positive charge in the case where it is the N type) is stored in the second gate electrode (floating gate) of the second MIS transistor and the storage state in the first storage mode is the second storage state in which no charge (a positive charge in the case where the first conductivity type is the P type and a negative charge in the case where it is the N type) is stored in the first semiconductor layer of the first MIS transistor, the difference in the voltage between the first gate electrode of the first MIS transistor and the first semiconductor layer is lower than the threshold voltage of the first MIS transistor, and in cases other than the above, that is to say, in the case where the storage state in the second storage mode is such a state that no charge is stored in the second gate electrode (floating gate) of the second MIS transistor or the storage state in the first storage mode is the first storage state in which a charge is stored in the first semiconductor layer of the first MIS transistor, the difference in the voltage between the first gate electrode of the first MIS transistor and the first semiconductor layer is sufficiently higher than the threshold voltage of the first MIS transistor so that an inversion layer is formed in the region on the surface of the first semiconductor layer beneath the first gate electrode, and the fourth storing voltage applied to at least the first drain region or the first source region crosses the inversion layer and causes capacitance coupling with the first gate electrode via the first gate insulating film. Thus, only in the case where the storage state in the second storage mode is such that a charge is stored in the second gate (floating gate) of the second MIS transistor and the storage state in the first storage mode is the second storage state where no charge is stored in the first semiconductor layer of the first MIS transistor, there is no capacitance coupling with the floating gate caused by the fourth storing voltage applied to at least either the first drain or first source region of the first MIS transistor. Accordingly, the floating gate is at a voltage between the sixth storing voltage and the ground voltage as a result of capacitance coupling so that the difference in the potential between the fifth storing voltage, which is applied to the second drain region of the second MIS transistor, and the floating gate is sufficiently secured so that the stored charge can be drawn out from the second gate electrode (floating gate) towards the second drain region or hot carriers having the opposite polarity to the stored charge are generated in the vicinity of the second drain region and are injected into the second gate electrode so as to offset the charge stored in the second gate electrode. As a result, the second storage state in the first storage mode can be transferred to the storage state in the second storage mode.

In the case where the storage state in the second storage mode is such a state that no charge is stored in the second gate electrode (floating gate) of the second MIS transistor or the storage state in the first storage mode is the first storage state in which a charge is stored in the first semiconductor layer of the first MIS transistor, the fourth storing voltage that has passed through the formed inversion layer causes capacitance coupling with the first gate electrode via the first gate insulating film so that the voltage of the floating gate changes in the same direction as in the case where the amount of charge stored in the floating gate decreases in comparison with the above described case, and thus, the difference in the potential between the second gate electrode and the second drain region does not reach to such a level that the above described carrier transfer is possible. As a result, only in the case where the storage state in the second storage mode is such a state that a charge is stored in the second gate electrode (floating gate) of the second MIS transistor and the storage state in the first storage mode is the second storage state in which no charge is stored in the first semiconductor layer of the first MIS transistor, the second storage state in the first storage mode can be transferred to the storage state in the second storage mode.

Furthermore, the nonvolatile random access memory according to the present invention has a ninth characteristic such that the first data writing circuit carries out a data inversion process, in which the storage state in the first storage mode is inverted, after the recall circuit completes the recall process.

Furthermore, the nonvolatile random access memory according to the present invention has a tenth characteristic such that the first data writing circuit carries out a data inversion process, in which the storage state in the first storage mode is inverted, before the first storing circuit carries out the first storing process and the second storing circuit carries out the second storing process.

According to the above described nonvolatile random access memory having the ninth or tenth characteristic, in the case where the storage state in each storage mode corresponds to the two value data "0" or "1" so that the two value data "0" and "1" is inverted when two value data "0" and "1" allocated for the storage state in the second storage mode is transferred to the storage state in the first storage mode through the initialization process and the recall process by means of the recall circuit, or in the case where the storage state in each storage mode corresponds to two value data "0" or "1" so that the two value data "0" and "1" is inverted when the two value data "0" and "1" allocated to the storage state in the first storage mode is transferred to the storage state in the second storage mode in the first and second storing processes by means of the first and second storing circuits, "0" and "1" in the storage state in the first storage mode for the readout operation may be switched when the first and second storing processes and the recall process are carried out, but the state where the two value data is switched is corrected when a data reversing process is carried out.

The nonvolatile random access memory according to the present invention is further provided with a reset circuit arranged to initialize the storage state in the second storage mode, and has an eleventh characteristic such that the reset circuit applies a negative first reset voltage or a ground voltage to one of the first drain region and the first source region when the first conductivity type is the P type and a positive first reset voltage or a ground voltage when the first conductivity type is the N type with the other of the first drain region and the first source region in a floating state, and applies a second reset voltage having a polarity opposite to the first reset voltage to the second drain region with the second source region and the second semiconductor layer in a floating state, in order to control the voltage of the second gate electrode through the capacitance coupling between the first gate and the one of the first drain region and the first source region to which the first reset voltage is applied, so that the charge stored in the floating gate is drawn out or a charge having the polarity opposite to that of the stored charge is injected, due to the voltage between the second gate electrode and the second drain region, and the state in which a charge is stored in the floating gate is initialized.

According to the above described nonvolatile random access memory having the eleventh characteristic, the storage state in the second storage mode of the memory cells can be initialized to such a state that no charge is stored in the second gate electrode (floating gate) of the second MIS transistor. That is to say, the first resetting voltage applied to either the first drain region or the first source region is a negative voltage in the case where the first conductivity type is the P type, a positive voltage in the case where the first conductivity type is the N type, or a ground voltage, and therefore, the junction between the first drain region and the first semiconductor layer is biased in the forward direction or in a non-biased state so that there is capacitance coupling between the first resetting voltage and the voltage of the second gate electrode, and therefore, the second gate electrode (floating gate) can be set to a sufficiently negative potential in the case where the first conductivity type is the P type and can be set to a sufficiently positive potential in the case where the first conductivity type is the N type irrelevant of the state in which a charge is stored in the second gate electrode (floating gate) (storage state in the second storage mode) and the state in which a charge is stored in the first semiconductor layer (storage state in the first storage mode). As a result, sufficient difference in the potential can be secured between the second resetting voltage applied to the second drain region of the second MIS transistor and the second gate electrode (floating gate) so that the stored charge is drawn out from the second gate electrode towards the second drain region or hot carriers having the opposite polarity to the stored charge are generated in the vicinity of the second drain region and injected into the second gate electrode, and thus, the charge stored in the second gate electrode can be offset.

Furthermore, the nonvolatile random access memory according to the present invention has a twelfth characteristic such that the first semiconductor layer and the second semiconductor layer are formed on an insulator substrate or on an impurity diffusion layer of the second conductivity type that is set to such a potential state that the junction between the first semiconductor layer and the second semiconductor layer is in a reverse-direction bias state, and the sides of the first semiconductor layer and the second semiconductor layer are surrounded by an element isolation film.

According to the above described nonvolatile random access memory having the twelfth characteristic, the first semiconductor layer in an electrically floating state and the second semiconductor layer insulated from the first semiconductor layer can be concretely implemented.

The nonvolatile random access memory according to the present invention has the thirteenth characteristic such that it is further provided with: a memory cell array where a number of the memory cells are aligned in rows and columns; a number of first word lines, to each of which the second drain regions of the memory cells in the same row are connected; a number of second word lines, to each of which the second source regions and second semiconductor layers of the memory cells in the same row are connected; a number of bit lines, to each of which the first drain regions of the memory cells in the same column are connected; one or more source lines, to each of which the first source regions of the memory cells in the same row or column, or all of the memory cells within the memory cell array are connected; and a voltage control means arranged to control the voltage to be applied to each of the first word lines, the second word lines, the bit lines and the source lines.

According to the above described nonvolatile random access memory having the thirteenth characteristic, it is possible to implement a nonvolatile random access memory with a memory cell array where memory cells made up of two transistors having a minimal number of nonvolatile memory cells and volatile memory cells, which can be mounted on a substrate during a standard CMOS process, are aligned in the row direction and the column direction.

Here, the first word lines are connected to the second drain regions of the second MIS transistors and the second word lines are connected to the second source regions of the second MIS transistor and the second semiconductor layers so that the bit lines and the source lines can be connected to the first drain regions of the first MIS transistors and the first source regions of the first MIS transistors, respectively. The arrangement of the word lines, the bit lines and the source lines is different from the arrangement in the connection of the word lines, the bit lines and the source lines in the conventional nonvolatile semiconductor device disclosed in Patent Document 3, and the arrangement in the invention allows the writing and readout operations in the first storage mode to be carried out with priority over the second storage mode in a random access memory. That is to say, the nonvolatile random access memory having the thirteenth characteristic functions as a random access memory for a usual memory operation, as its name indicates.

BRIEF DESCRIPTION OF THE DRAWINGS

FIG. 7 is a table showing the storage state in each part along the recall process that is carried out on a memory cell of the nonvolatile random access memory according to the present invention;

FIG. 11 is a table showing the storage state in each part along the recall process that is carried out on a memory cell of the nonvolatile random access memory according to the present invention;

BEST MODE FOR CARRYING OUT THE INVENTION

Figure 1:
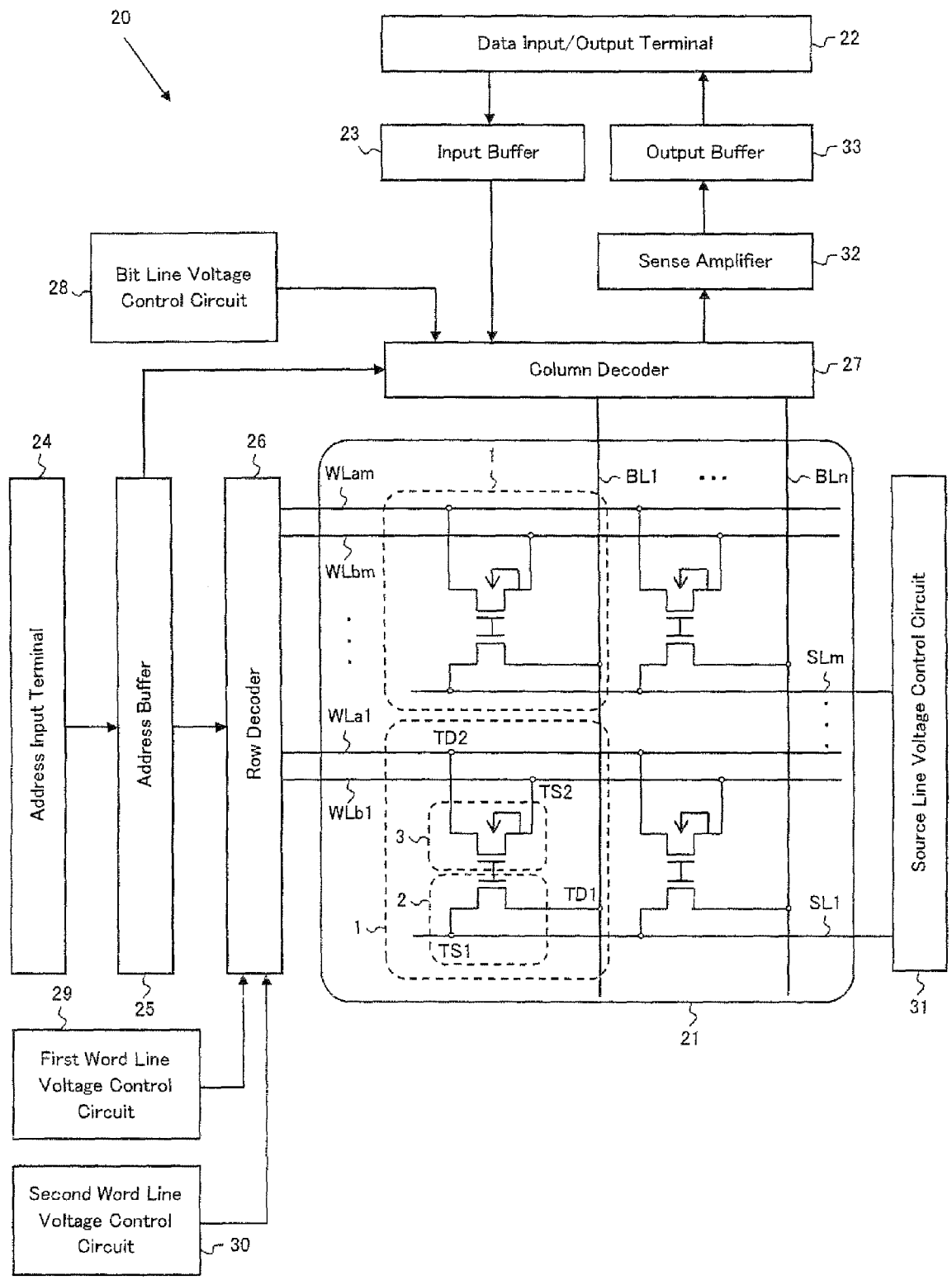
FIG. 1 is a block diagram schematically showing the block configuration of the nonvolatile random access memory according to one embodiment of the present invention.

Next, the nonvolatile random access memory according to one embodiment of the present invention is described in reference to the drawings.
Description of NVRAM First, an example of the structure of the entirety of the nonvolatile random access memory according to the present embodiment (hereinafter simply referred to as present NVRAM) is described. FIG. 1 is a block diagram schematically showing the entire configuration of the block of the present NVRAM. As shown in FIG. 1, the present NVRAM 20 is formed of a memory cell array 21 where a number of memory cells are aligned in a matrix, a data input/output terminal 22, an input buffer 23, an address input terminal 24, an address buffer 25, a row decoder 26, a column decoder 27, a bit line voltage control circuit 28, a first word line voltage control circuit 29, a second word line voltage control circuit 30, a source line voltage control circuit 31, a sense amplifier 32, an output buffer 33 and a control means for controlling the above described control circuits and buffers (not shown).

The memory cell array 21 is formed of a number of memory cells 1 that can be electrically written and are aligned in a matrix. Each memory cell 1 is formed of a first MIS transistor 2 that functions as a DRAM cell and a second MIS transistor 3 that functions as an EEPROM cell transistor. At this time, the gate electrode of the first MIS transistor 2 (hereinafter referred to as first gate electrode) and the gate electrode of the second MIS transistor 3 (hereinafter referred to as second gate electrode) are electrically connected to each other within the same memory cell, so that a floating gate is formed in a floating state, in which it is electrically insulated from the other terminals of the two transistors 2 and 3.

In memory cells 1 aligned in the same row, the drain diffusion regions of the second MIS transistors 3 (hereinafter referred to as second drain region) are connected to the same first word line WLai (i=1 to m, m being the number of rows in the memory cell array 21), the source diffusion regions of the second MIS transistors 3 (hereinafter referred to as second source region) are connected to the same second word line WLbi, which is different from the first word line WLai, and the source diffusion regions of the first MIS transistors 2 (hereinafter referred to as first source region) are connected to the same source line SLi. In addition, in memory cells 1 aligned in the same column, the drain diffusion regions of the first MIS transistors 2 (hereinafter referred to as first drain region) are connected to the same bit lines BLj (j=1 to n, n being the number of columns in the memory cell array 21).

The bit line voltage control circuit 28 controls the voltage of each bit line BLj, the first word line voltage control circuit 29 controls the voltage of each first word line WLai, the second word line voltage control circuit 30 controls the voltage of each second word line WLbi, and the source line voltage control circuit 31 controls the voltage of each source line SLi.

When an address signal is inputted via the address input terminal 24, the address buffer 25 divides the inputted address signal into a row address and a column address, which are respectively inputted into the row decoder 26 and the column decoder 27. The row decoder 26 selects a pair of first and second word lines WLai and WLbi corresponding to the inputted row address, while the column decoder 27 selects one or more bit lines BLj corresponding to the inputted column address. The number of bit lines BLj selected at one time corresponds to the bit width of the unit data stored in the memory cell array 21.

In the case where the structure allows the source lines SLi to be selected for each row, a target source line SLi is selected when controlled by the row decoder 26, so that a predetermined voltage is applied to the selected source line SLi in accordance with the process—programming, readout or erasing. Meanwhile, in the case where the structure is such that the source lines SLi do not need to be selected for each row, the same voltage predetermined in accordance with the process described above is applied to all of the source lines SLi. Here, though FIG. 1 shows an example of a case where Other first source regions of memory cells 1 aligned in the same row are connected to the same source line SLi, a configuration where the first source regions of memory cells 1 aligned in the same column are connected to the same source line SLj is also possible. In this case, where the configuration allows a source line SLj to be selected for each column, the target source line SLj is selected when controlled by the column decoder 27, and a voltage predetermined in accordance with the process described above is applied to the selected source line SLj.

The data inputted through the data input/output terminal 22 is programmed into the memory cell 1 selected by the row decoder 26 and the column decoder 27 via the input buffer 23, or the data programmed into the memory cell 1 selected by the row decoder 26 and the column decoder 27 is read out and amplified via the sense amplifier 32 and after that outputted to the data input/output terminal 22 via the output buffer 33.
Description of Memory Cells Next, the memory cells 1 that form the memory cell array 21 of the present NVRAM 20 are described in reference to FIGS. 1 and 2.

Figure 2A:
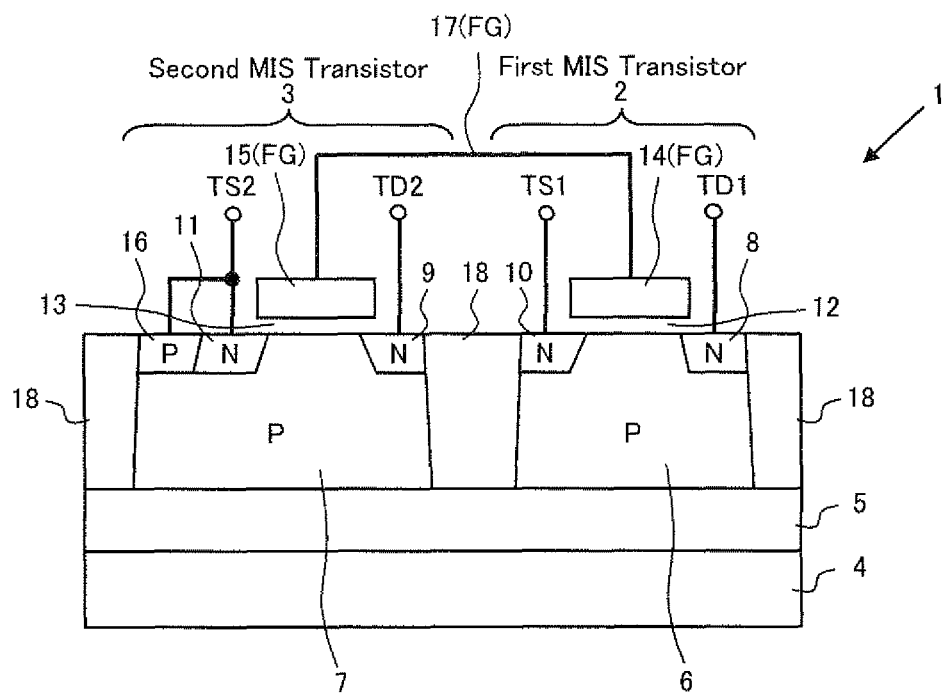
FIG. 2A is a schematic cross sectional diagram showing the structure of the memory cell used in the nonvolatile random access memory according to the present invention in a cross section.
Figure 2B:
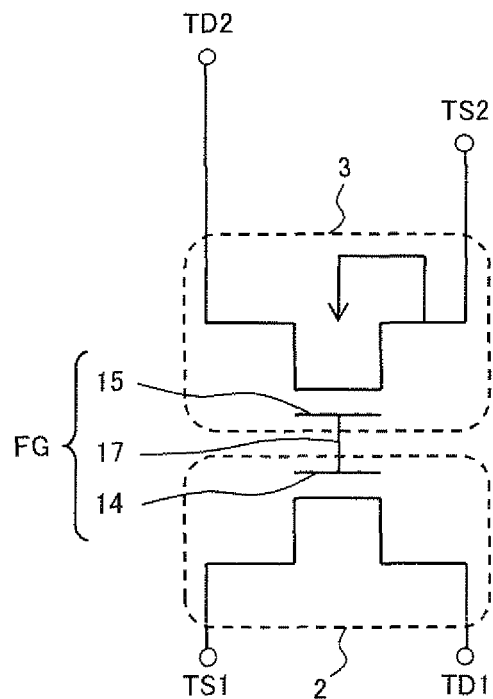
FIG. 2B is an equivalent circuit diagram thereof.

FIG. 2 is a diagram showing the structure of a memory cell 1. FIG. 2A is a schematic cross sectional diagram showing the structure of a memory cell 1 in a cross section, and FIG. 2B shows the equivalent circuit thereof. Here, the cross sectional structure of the memory cell 1 is schematically shown in FIG. 2A, and the dimensions of the actual structure do not necessarily correspond to those in the diagram.

As shown in FIG. 2, the memory cells 1 are formed of a first MIS transistor 2 and a second MIS transistor 3.

In each memory cell 1 within the memory cell array 21, the first drain region 8 of the first MIS transistor 2 is connected to a bit line BLj via a contact TD1, the first source region 10 is connected to a source line SLi via a contact TS1, and the first gate electrode 14 is connected to the second gate electrode 15 of the second MIS transistor 3 through a conductor 17. In addition, the second drain region 9 of the second MIS transistor 3 is connected to a first word line WLai via a contact TD2, and the second source region 11 is connected to a second word line WLbi via a contact TS2. Here, the first gate electrode 14 of the first MIS transistor 2 is electrically insulated from the first drain region 8 and the first source region 10 through the first gate insulating film 12, and the second gate electrode 15 of the second MIS transistor 3 is electrically insulated from the second drain region 9 and the second source region 11 through the second gate insulating film 13. Furthermore, the first semiconductor layer 6 where the first MIS transistor 2 is formed and the second semiconductor layer 7 where the second MIS transistor 3 is formed are electrically insulated from each other by an element isolation film 18.

In the following, the structure of the memory cells 1 is described in further detail.

Figure 16A:
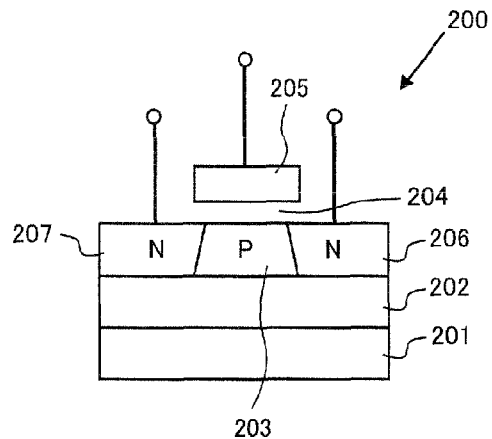
FIG. 16A is a schematic cross sectional diagram showing the structure of a memory cell in a DRAM where data can be electrically written, which can be mounted on a substrate without adding any new steps in a conventional standard CMOS process in a cross section.
Figure 16B:
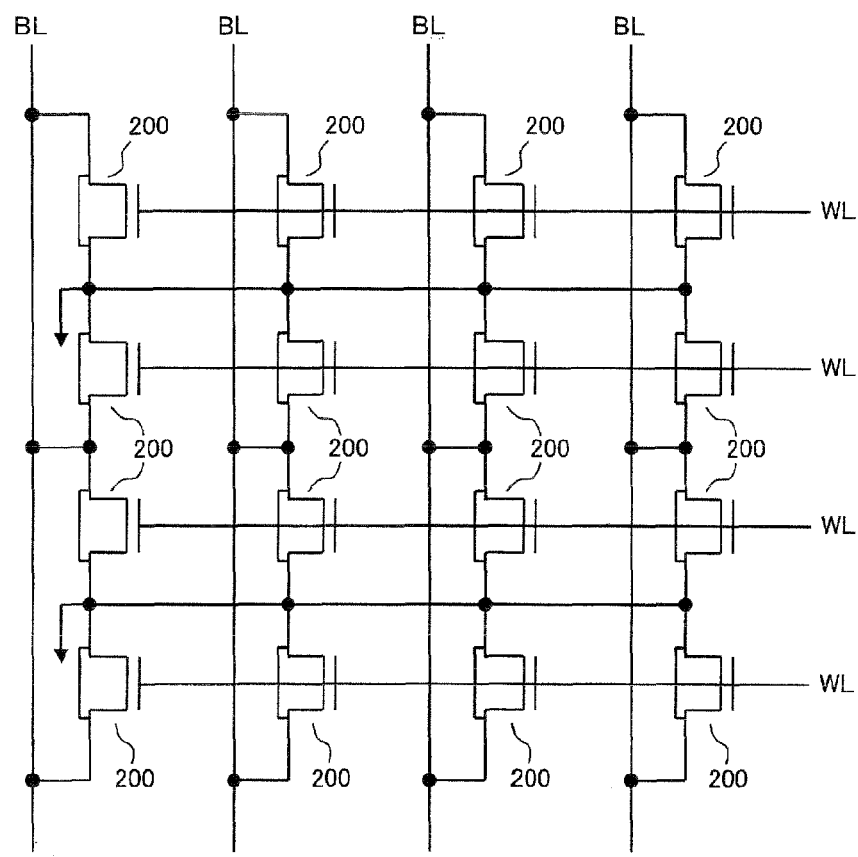
FIG. 16B is an equivalent circuit diagram thereof.

As shown in FIG. 2A, the first MIS transistor 2 is formed using an SOI (silicon on insulator) substrate where a silicon oxide film layer 5 is layered on a semiconductor substrate 4 and a first semiconductor layer 6 and a second semiconductor layer 7 are formed of a P type silicon layer on top, as in the MIS transistors that form the memory cells of a DRAM that can be mounted on a substrate without adding any new steps in the standard CMOS process disclosed in Patent Document 4 (see FIG. 16), and the first MIS transistor 2 is formed of a first drain region 8 and a first source region 10 made of an N type impurity diffusion layer which are separated on the first semiconductor layer 6 of the SOI substrate. The first gate electrode 14 is formed through the first gate insulating film 12 so as to overlap with the region between the first drain region 8 and the first source region 10 above the first semiconductor layer 6. The first semiconductor layer 6 and the second semiconductor layer 7 are each independently in a floating state and make contact with the silicon oxide film layer 5 from the bottom with the sides surrounded by the element isolation film 18.

The first MIS transistor 2 forms a DRAM cell which dynamically stores a state in which excessive majority carriers are held in the first semiconductor layer 6, thus providing a first threshold voltage (first storage state) and a state in which excessive majority carriers are released from the first semiconductor layer 6, thus providing a second threshold voltage (second storage state). In the present embodiment, the first semiconductor layer 6 is a P type silicon layer, and therefore, the majority carriers are holes, and in the first storage state, in which excessive majority carriers are held, the potential of the first semiconductor layer 6 is high, and thus, the threshold voltage is lower than in the second storage state. The storage of two-value data in the first MIS transistor 2 is volatile, and in the following, the storage mode in the first MIS transistor 2 is referred to as first storage mode.

Figure 15A:
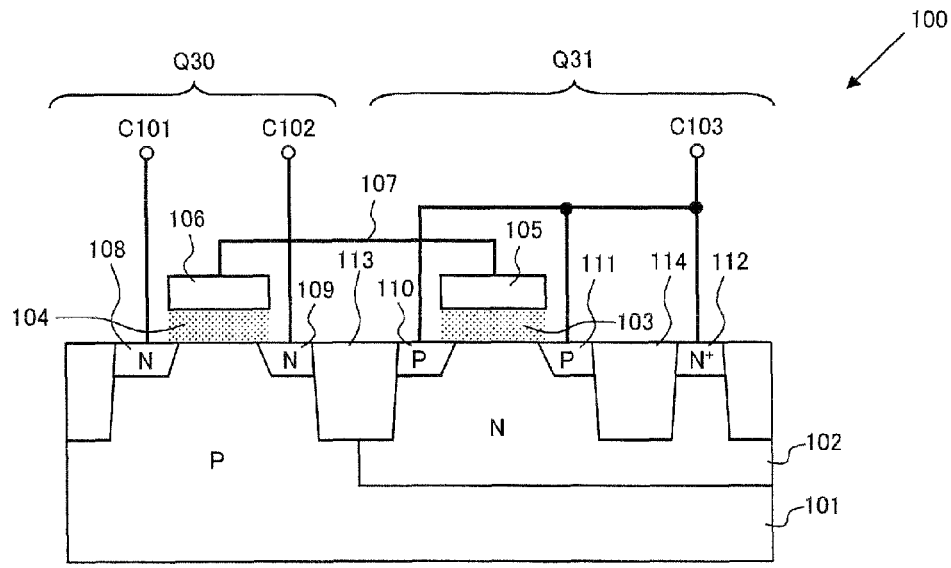
FIG. 15A is a schematic cross sectional diagram showing the structure of a memory cell in a nonvolatile semiconductor memory device that can be mounted on a substrate during a conventional standard CMOS process in a cross section.
Figure 15B:
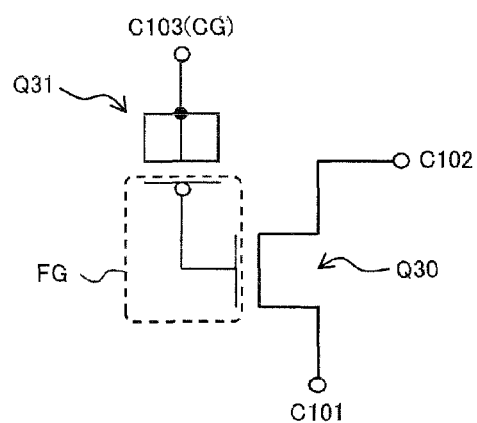
FIG. 15B is an equivalent circuit diagram thereof.

In addition, the second MIS transistor 3 is formed of the second drain region 9 and the second source region 11 made of an N type impurity diffusion layer, which are separated on the second semiconductor layer 7 made of a P type silicon layer, as in the MOS transistor Q30 that forms a memory cell of a nonvolatile semiconductor memory device that can be mounted on a substrate without adding any new steps in the standard CMOS process disclosed in Patent document 4 (see FIG. 15A). The second gate electrode 15 is formed through the second gate insulating film 13 so as to overlap with the region between the second drain region 9 and the second source region 11 above the second semiconductor layer 7. Furthermore, a contact region 16 is formed of a P type impurity diffusion layer on the second semiconductor layer 7 and electrically connected so that it has the same potential as the second source region 11. As a result, the second semiconductor layer 7 and the second source region 11 have the same potential.

The first gate electrode 14 and the second gate electrode 15 are electrically connected to each other through a conductor 17, so that a floating gate FG is formed. Here, the first gate electrode 14 and the second gate electrode 15 may be integrally formed of the same conductive material so as to be electrically connected. In this case, the first gate electrode 14, the second gate electrode 15 and the conductor 17 are formed at the same time during the process for forming the conductor 17.

Accordingly, the memory cells 1 form a nonvolatile memory cell, just as the memory cell disclosed in Patent Document 4 (see FIG. 15A), where the first gate electrode 14, the second gate electrode 15 and the conductor 17 form a floating gate FG, the second drain region 9 and the second source region 11 are the drain and the source, and at least the first drain region 8 or the first source region 10 is a control gate CG. That is to say, the memory cells 1 are in a high threshold voltage state (second storage state) when electrons are stored in the floating gate FG, which is thus negatively charged and in a low threshold voltage state (first storage state) after electrons are released from the floating gate FG, and thus store one of the two storage states as nonvolatile two-value data. In the following, the storage mode in the second MIS transistor 3 is differentiated from the storage mode in the first MIS transistor 2, and thus referred to as second storage mode.

The memory cells 1 in the present NVRAM 20 and the memory cell disclosed in Patent Document 4 are similar in that the gates of the two MIS transistors are electrically connected so as to form a floating gate, and thus a nonvolatile memory cell is formed. However, the two are different in that the second MIS transistor 3 is formed on an SOI substrate in the structure of the memory cells 1. They are also different in that the first MIS transistor 2 operates as a transistor in the structure of the memory cells 1, while the corresponding transistor in the memory cell disclosed in Patent Document 4 functions as a MOS capacitor and does not operate as a transistor. Furthermore, in the memory cell disclosed in Patent Document 4, the MOS transistor Q30 is an N type MOSFET formed on a P type semiconductor layer and the MOS capacitor Q31 is a P type MOSFET formed on an N type semiconductor layer (see FIG. 15A), while the first MIS transistor 2 and the second MIS transistor 3 in the memory cells 1 are both N type MOSFET's formed on the first semiconductor layer 6 and the second semiconductor layer 7, which are both of the P type. Moreover, in the memory cell disclosed in Patent document 4, the P type semiconductor layer where the MOS transistor Q30 is formed is not electrically connected to the drain region or the source region of the MOS transistor Q30, so that they do not necessarily have the same potential, while in the second MIS transistor 3 in the memory cells 1, the second semiconductor layer 7 and the second source region 11 are electrically connected to each other so as to have the same potential.

The processes carried out in the memory cells 1—data writing and data readout in the first storage mode, data transfer from the storage state in the second storage mode to the storage state in the first storage mode (recall process), data transfer from the storage state in the first storage mode to the storage state in the second storage mode (storing process) and the initialization process of the storage state in the second storage mode—are described below in detail. In the description below, the first semiconductor layer 6 and the second semiconductor layer 7 are P type silicon layers, as described above. In addition, the first storage state in which the threshold voltages for the first MIS transistor 2 and the second MIS transistor 3 are low corresponds to "1" of the two-value data both in the first and second storage mode, while the second storage state in which the threshold voltages are high corresponds to "0" of the two-value data. However, the correspondence between the storage states in the first and second storage mode and "0" and "1" of the two-value data is not limited to this.

Description of Data Writing in First Storage Mode

Figure 3:
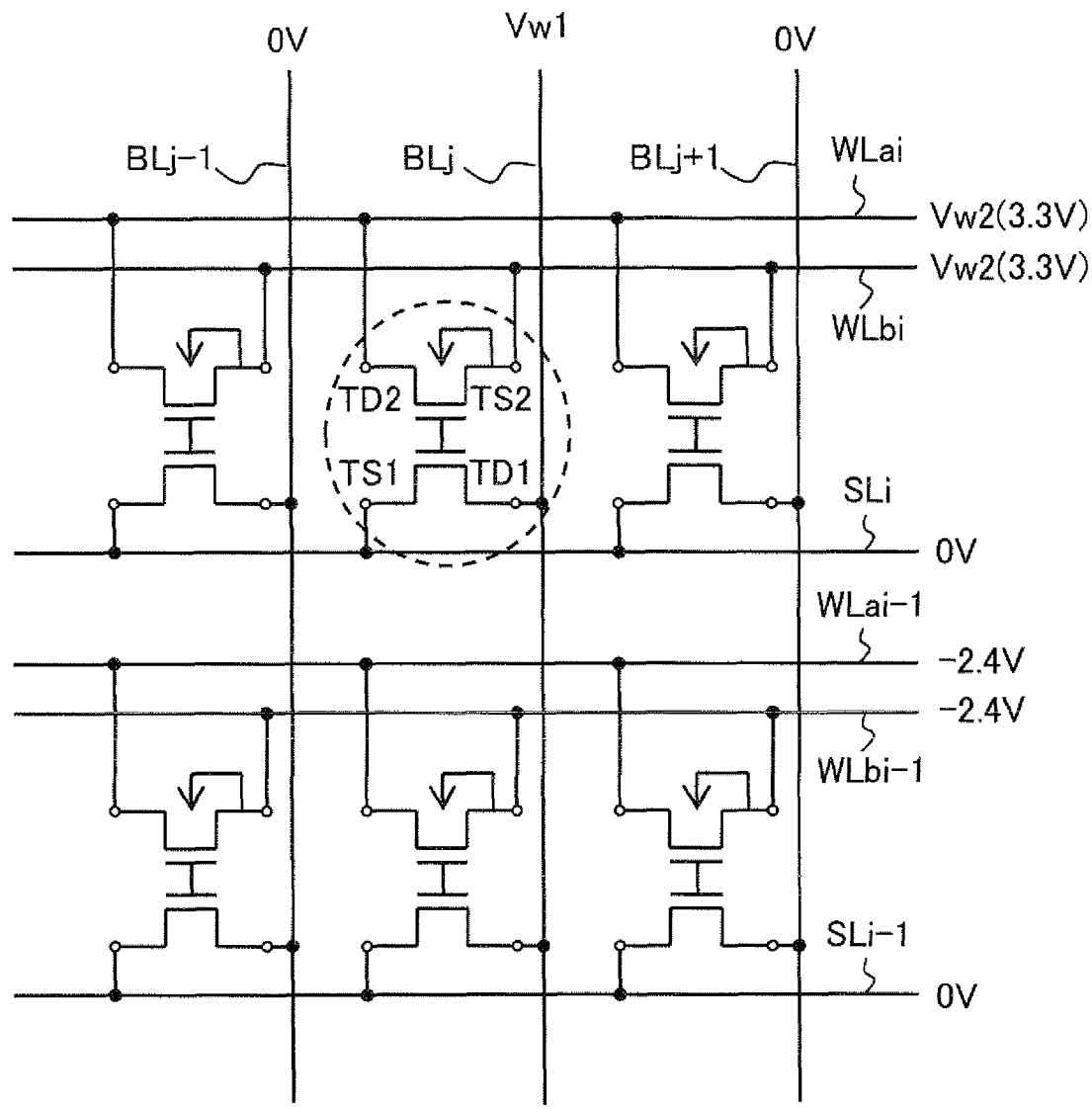
FIG. 3 is a circuit diagram showing a memory cell array in a state in which a voltage is applied in the case where data "1" in the first storage mode is programmed into a memory cell of the nonvolatile random access memory according to the present invention.
Figure 4:
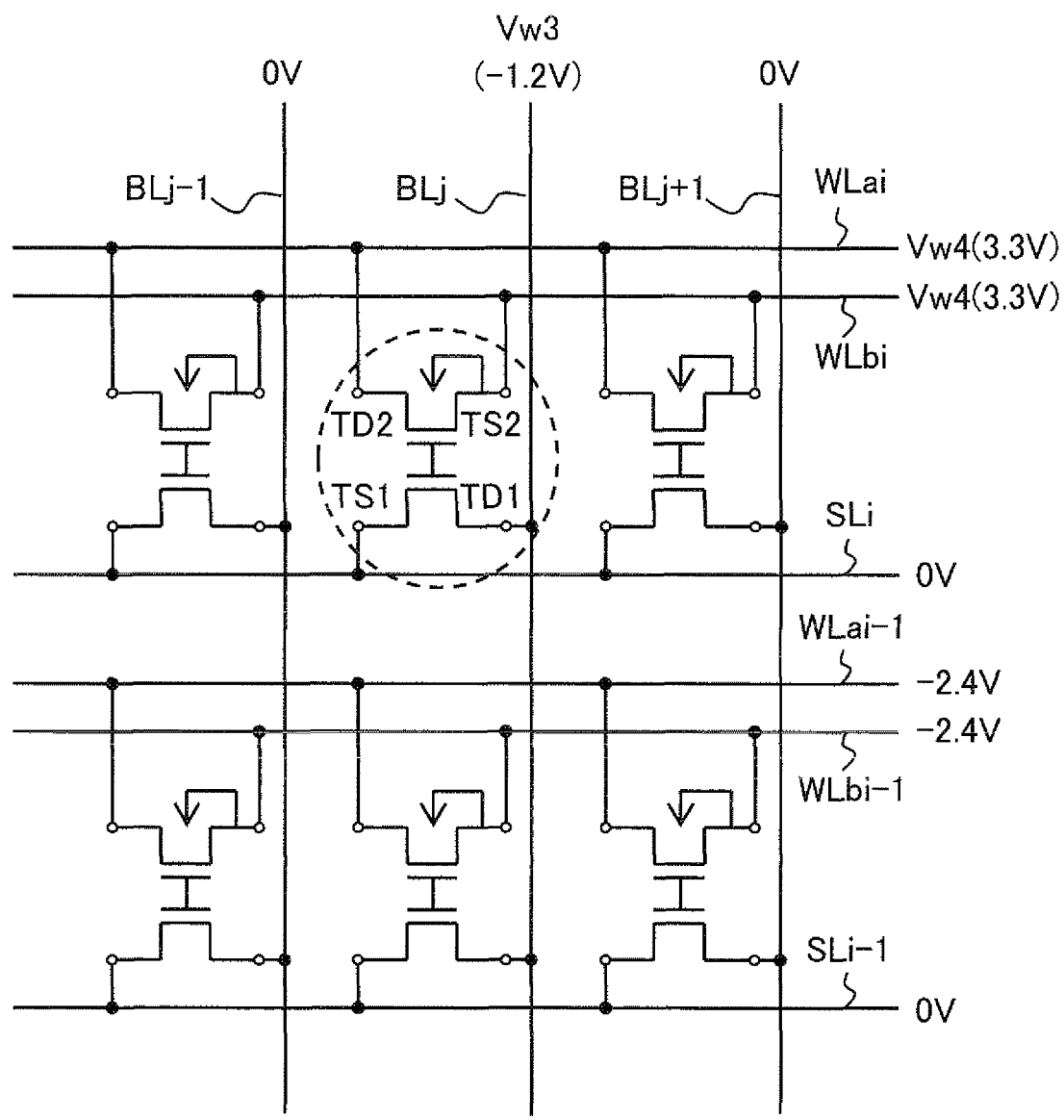
FIG. 4 is a circuit diagram showing a memory cell array in a state in which a voltage is applied in the case where data "0" in the first storage mode is programmed into a memory cell of the nonvolatile random access memory according to the present invention.

First, data writing in the first storage mode is described in reference to FIGS. 3 and 4. Here, in the present embodiment programming of data "0" and programming of data "1" are collectively referred to as data writing.

In the case where data "1" is programmed into the first MIS transistor 2; that is to say, in the case where the first semiconductor layer 6 is converted to a state where excessive holes; that is, excessive majority carriers, are stored, as shown in FIG. 3, a positive second programming voltage Vw2 (for example 3.3 V) is applied to the first word line WLai and the second word line WLbi which are connected to the memory cell 1 to be programmed, and a positive first programming voltage Vw1 (for example 3.3 V) is applied to the bit line BLj which is connected to the memory cell 1 to be programmed, while the source line SLi is grounded. As a result, the potential of the first gate electrode 14 of the memory cell 1 to be programmed increases due to the capacitance coupling between the second gate electrode 15 and the second drain region 9, the second source region 11 and the second semiconductor layer 7, so that impact ions are generated in the vicinity of the first drain region 8, and as a result, holes are stored in the first semiconductor layer 6, which is in an electrically floating state. This is the first storage state. Here, a negative voltage (for example −2.4 V) is applied to the first word lines WLai and the second word lines WLbi in the unselected rows, and the bit lines BLj in the unselected columns are grounded. As a result, data "1" can be prevented from being programmed into the unselected memory cells 1.

In the case where data "0" is programmed into the first MIS transistor 2; that is to say, in the case where excessive holes or excessive carriers are released from the first semiconductor layer 6, as shown in FIG. 4, a positive second programming voltage Vw2 (for example 3.3 V) is applied to the first word line WLai and the second word line WLbi which are connected to the memory cell 1 to be programmed, and a negative third programming voltage Vw3 (for example −1.2 V) is applied to the bit line BLj which is connected to the memory cell 1 to be programmed, while the source line SLj is grounded. As a result, the junction between the first drain region 8 and the first semiconductor layer 6 in the memory cell 1 to be programmed becomes of a forward direction bias state, in which the holes stored in the first semiconductor layer 6 are released into the first drain region 8. This is the second storage state. Here, a negative voltage (for example −2.4 V) is applied to the first word lines WLai and the second word lines WLbi in the unselected rows, and the bit lines BLj in the unselected columns are grounded. As a result, data "0" can be prevented from being programmed into the unselected memory cells 1.

Here, the row decoder 26, the column decoder 27, the bit line voltage control circuit 28, the first word line voltage control circuit 29, the second word line voltage control circuit 30 and the source line voltage control circuit 31 work together, so that the first to third programming voltages Vw1 to Vw3 are applied when data "0" and "1" is programmed, as described above, and these circuit form a data writing circuit for writing data at the time of programming.

Description of Data Readout in First Storage Mode

Figure 5:
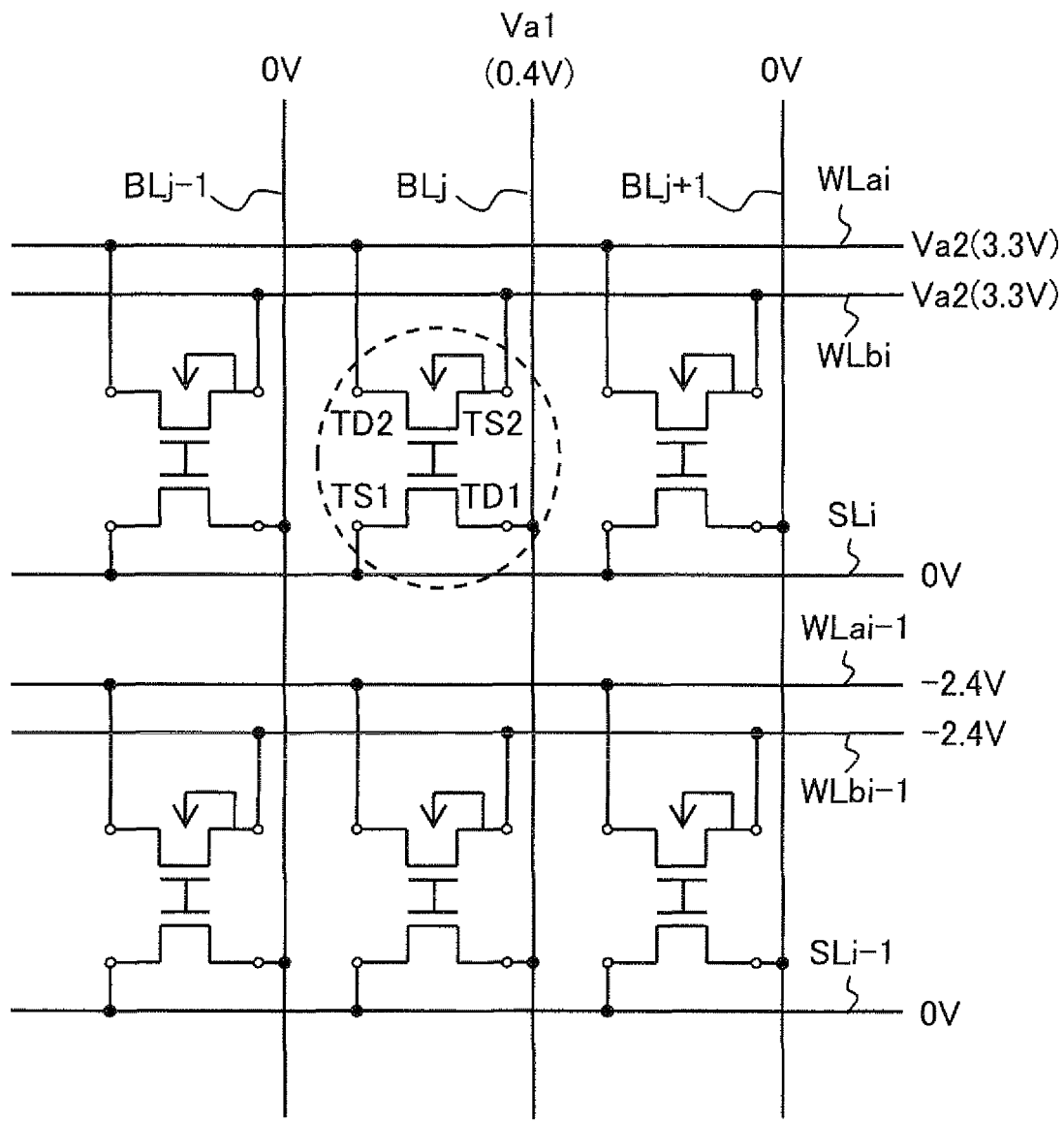
FIG. 5 is a circuit diagram showing a memory cell array in a state in which a voltage is applied in the case where data in the first storage mode is read out from a memory cell of the nonvolatile random access memory according to the present invention.

Next, data readout in the first storage mode is described in reference to FIG. 5.

Before the readout operation, the memory cells 1 are in a data holding mode, where a negative voltage (for example −2.4 V) is applied to all of the first word lines WLai and second word lines WLbi. As shown in FIG. 5, as the readout operation starts, a predetermined positive second readout voltage Va2 (for example 3.3 V) is applied to the first word line WLai and the second word line WLbi which are connected to the memory cell 1 to be read out from, and a positive first readout voltage Va1 (for example 0.4 V) is applied to the bit line BLj which is connected to the memory cell 1 to be read out from, while the source line SLi is grounded. Here, the same negative voltage as in the data holding mode keeps being applied to the first word lines WLai and the second word lines WLbi in the unselected rows, so that the memory cells 1 in the unselected rows are in the data holding mode. In addition, the bit lines BLj in the unselected columns are grounded, so that data is not read out from the memory cells 1 in the unselected columns.

As a result, the potential of the first gate electrode 14 of the memory cell 1 to be read out from increases due to the capacitance coupling between the second gate electrode 15 and the second drain region 9, the second source region 11 and the second semiconductor layer 7, so that the voltage of the first gate electrode 14 relative to the first source region 10 is between the two threshold voltages of the first MIS transistor 2 in the first and second storage state, or the same or higher than the two threshold voltages, and then the readout current flowing across the first drain region 8 and the first source region 10 changes in accordance with the threshold voltage state of the first MIS transistor 2. The difference in the readout current is detected by the sense amplifier 32 via the bit line BLj which is connected to the memory cell 1 to be read out from, so that the storage state in the first storage mode is read out.

Here, the method for detecting the difference in the readout current in accordance with the storage state of the first storage mode includes a method for directly detecting the readout current or the voltage value gained by converting the readout current to a voltage, as well as a method for driving the first word line WLai and the second word line WLbi after pre-charging a bit line BLj to a predetermined voltage and detecting the drop in the voltage of the bit line BLj at that time, a method for increasing the voltage of the bit line BLj after pre-charging the first word line WLai and the second word line WLbi to a predetermined voltage and detecting the difference in the rate of increase in the voltage of the bit line BLj, and a method for increasing the voltage of the first word line WLai, and the second word line WLbi after clamping the voltage of a bit line BLj to a predetermined voltage and detecting the difference in the readout current flowing through two bit lines BLj connected to memory cells in different storage states, and any detection method may be adopted.

Here, the row decoder 26, the column decoder 27, the bit line voltage control circuit 28, the first word line voltage control circuit 29, the second word line voltage control circuit 30, the source line voltage control circuit 31 and the sense amplifier 32 work together, so that the first and second readout voltage Va1 and Va2 are applied at the time of readout of data "0" and "1," as described above, and these circuits form a data readout circuit for reading out data at the time of readout.

A refreshing process is carried out after the data readout. The refreshing process is a process for programming data that is read out—"0" or "1"—into the memory cell 1 from which it was read out, and is basically the same process as the programming of data "0" or "1" described above. Accordingly, the refreshing process is carried out in the above described data programming circuit.

After carrying out the refreshing process, a negative voltage (for example −2.4 V) is applied to all of the first word lines WLai and second word lines WLbi. This is the data holding mode. In the above described data holding mode, when all of the first word lines WLai and second word lines SLbi are at the ground potential, the data holding time is shorter than in the case where a negative voltage is applied. However, they may be set at the ground potential, as long as the time is in an allowable range.

Description of Recall Process

Figure 6:
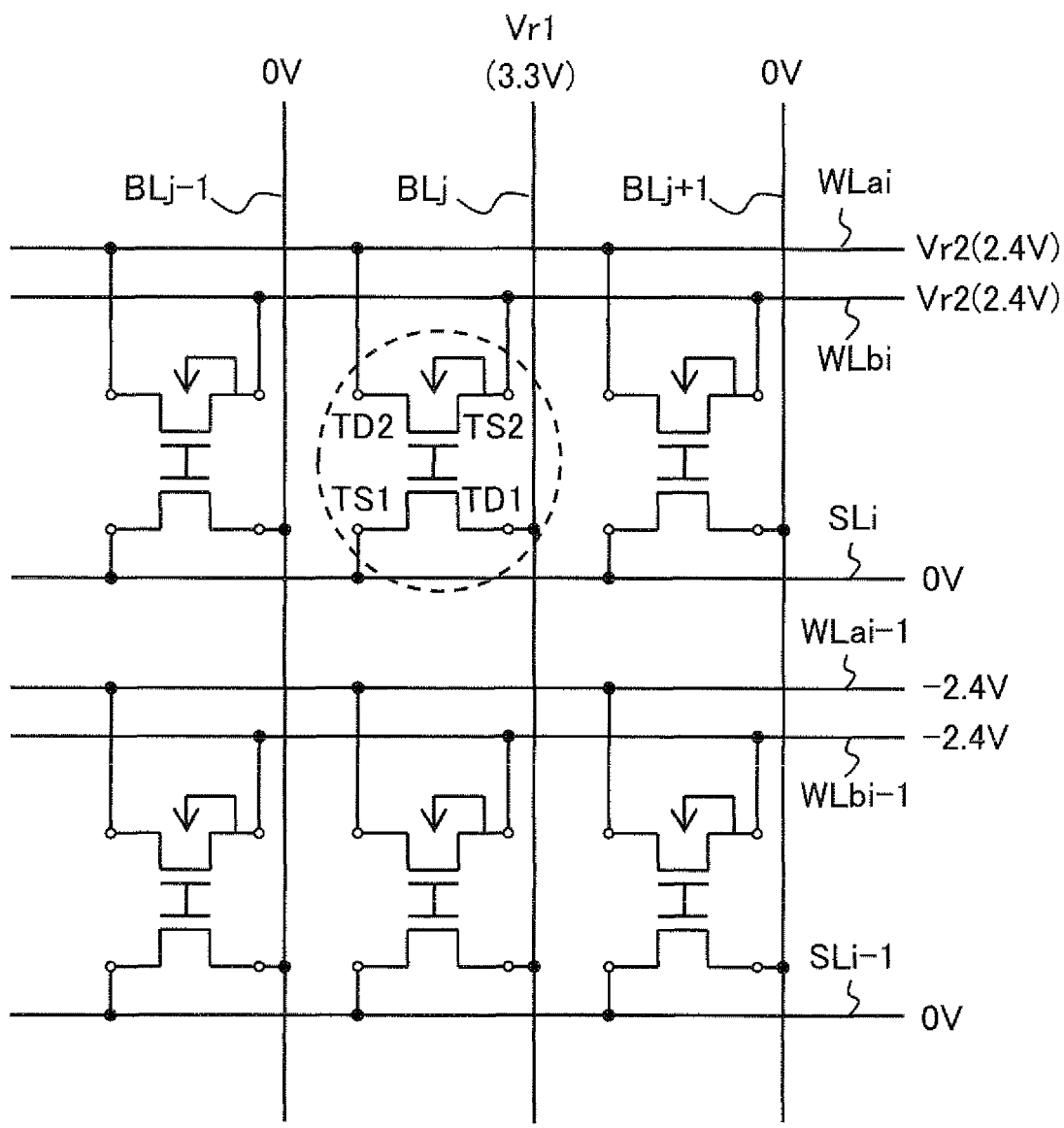
FIG. 6 is a circuit diagram showing a memory cell array in a state in which a voltage is applied in the case where a recall process is carried out on a memory cell of the nonvolatile random access memory according to the present invention.
Figure 8:
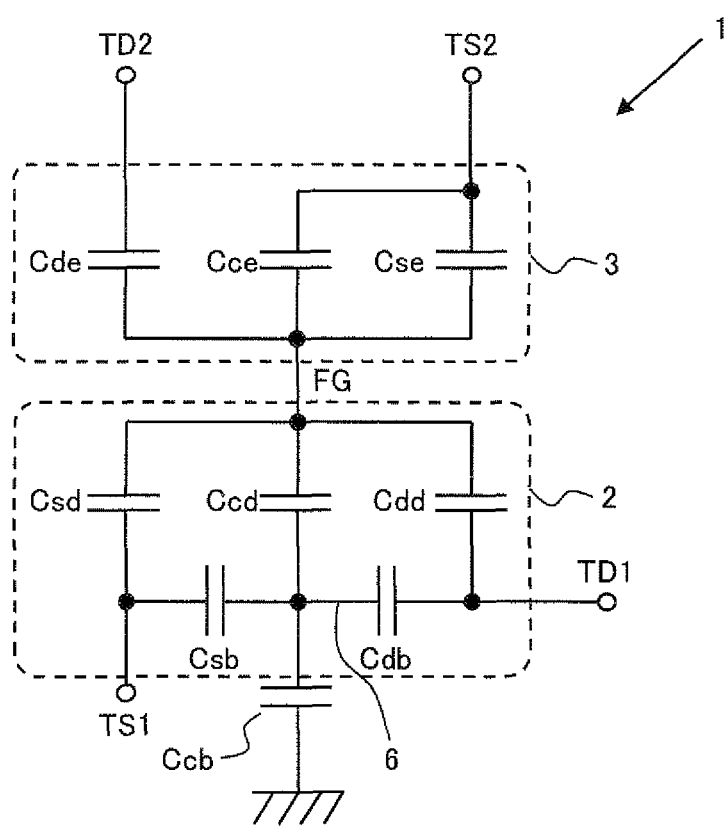
FIG. 8 is an equivalent circuit diagram showing the parasitic capacitance between nodes in a memory cell of the nonvolatile random access memory according to the present invention.

Next, the recall process, which is a process for transferring data from the storage state in the second storage mode to the storage state in the first storage mode, is described in reference to FIGS. 6 to 8. FIG. 6 is an equivalent circuit diagram showing a memory cell array in a voltage applying state for the below described main recall process on the memory cell 1 on which the recall process is to be carried out, and FIG. 7 is a table showing the storage state in each part over time during the main recall process. FIG. 8 is an equivalent circuit diagram showing parasitic capacitors between the nodes in the memory cell 1 in FIG. 2.

First, the recall process consists of a pre-recall process and a main recall process. In the pre-recall process, an initialization process (which is different from the initialization process for the second storage mode) in which the storage state in the first storage mode is converted to the second storage state (data "0"), in which no holes are stored in the first semiconductor layer 6, is carried out on the first MIS transistors 2 of the memory cells 1 on which the recall process is to be carried out (for example all of the memory cells in the memory cell array 21) before the main recall process. That is to say, a negative third recall voltage Vr3 (for example −1.2 V) is applied to the first drain region 8 in such a state that the first source region 10 is grounded, so that the junction between the first drain region 8 and the first semiconductor layer 6 becomes of a forward direction bias state, and the holes stored in the first semiconductor layer 6 are released toward the first drain region 8. This is the second storage state. The initialization process for the storage state in the first storage mode is exactly the same as the process for programming data "0," and the third recall voltage Vr1 corresponds to the third programming voltage Vw3. Accordingly, the above described process for programming data "0" is referred to for the concrete procedure for the pre-recall process, and descriptions that are the same are not repeated. Here, in the case where the initialization process is carried out on all of the memory cells, there are methods for carrying out the process memory cell by memory cell, carrying out the process on the memory cells row by row, carrying out the process on the memory cells column by column, or carrying out the process collectively on all of the memory cells, and which method should be adopted may be determined in accordance with the power consumed per memory cell 1 during the initialization process, and the number of memory cells 1 on which the recall process is to be carried out.

After carrying out the pre-recall process, the main recall process is carried out. As shown in FIG. 6, the source line SLi connected to the memory cell 1 on which the recall process is to be carried out is grounded, and a positive first recall voltage Vr1 (for example 3.3 V) is applied to the bit line BLj which is connected to the memory cell 1 on which the recall process is to be carried out, and a positive second recall voltage Vr2 (for example 2.4 V) is applied to the first word line WLai and second word line WLbi which are connected to the memory cell 1 on which the recall process is to be carried out. As a result, the voltage of the first gate electrode 14 of the memory cell 1 on which the recall process is to be carried out increases, due to the capacitance coupling between the second gate electrode 15 and the second drain region 9, the second source region 11 and the second semiconductor layer 7. The voltage of the first gate electrode 14 increases to a predetermined voltage Vfgr in accordance with the capacitance coupling ratio Rcge determined by the total Ccgd of the capacitances Cdd, Cse and Cce formed between the second gate electrode 15 and the second drain region 9, the second source region 11 and the second semiconductor layer 7, respectively, and the total Ccgd of the capacitances Cdd, Csd and Ccd formed between the first gate electrode 14 and the first drain region 8, the first source region 10 and the first semiconductor layer 6, respectively. The voltage Vfgr is calculated using Formula 1 below, using the capacitances in FIG. 8. Here, Rcge and Ctot in Formula 1 are calculated from Formula 2 below. In addition, Vbd, Vsd and Qfg in Formula 1 are the voltage of the first semiconductor layer 6, the voltage of the first source region 10 and the amount of charge in the floating gate FG (the amount of negative charge), respectively.

$$Vfgr = Cde/Ctot \times Vr2 + Cse/Ctot \times Vr2 + $$
$$Cce/Ctot \times Vr2 + Cdd/Ctot \times Vr1 + $$
$$Ccd/Ctot \times Vbd + Csd/Ctot \times Vsd - Qfg/Ctot$$
$$= Rcge \times Vr2 + Cdd/Ctot \times Vr1 + Ccd/Ctot \times $$
$$Vbd + Csd/Ctot \times Vsd - Qfg/Ctot$$

Formula 1

$$Rcge = Ccge/Ctot$$
$$Ctot = Ccge + Ccgd$$

Formula 2

Here, the source line SLi is grounded, the voltage Vsd of the first source region 10 is 0 V, and the pre-recall process converts the voltage Vbd of the first semiconductor layer 6 to 0 V, and therefore, the voltage Vsd and the voltage Vbd on the right in Formula 1 are omitted, and provided that the capacitance Cdd between the first drain region 8 and the first gate electrode 14 is sufficiently smaller than the total capacitance Ctot of the floating gate, Formula 1 can be simplified to the following Formula 3.

$$Vfgr = Rcge \times Vr2 - Qfg/Ctot$$

Formula 3

Formula 3 means that the voltage Vfgr of the first gate electrode 14 is a function of the second recall voltage Vr2 and the amount of charge Qfg stored in the floating gate FG (the amount of negative charge). Accordingly, the voltage Vfgr of the first gate electrode 14 changes in accordance with the amount of the charge Qfg stored in the floating gate FG; that is to say, the storage state in the second storage mode.

Meanwhile, the first MIS transistor 2 needs to be operated in a pentode region, so that impact ions are generated in the vicinity of the first drain region 8, in order to program data "1" into the first MIS transistor 2 that is initialized to the second storage state (data "0") through the pre-recall process and thus become of the first storage state. The generation of impact ions becomes maximum under conditions where the voltage Vgsd of the first gate electrode 14 relative to the first source region 10 is ½ of the voltage Vdsd of the first drain region 8 relative to the first source region 10 (Vgsd=Vdsd/2), and as Vgsd decreases, the generation of impact ions also decreases, and when Vgs is lower than the threshold voltage Vthd2 of the first MIS transistor 2 in the second storage state, the channel disappears and no drain current is generated, and thus, no impact ions are generated.

Here, in the main recall process, the voltage Vfgr of the first gate electrode 14 causes impact ions to be generated, and when Vgh1 is the lower limit value of the voltage Vfgr which makes it possible for holes to be injected into the first semiconductor layer 6, it is necessary for the following formula 4 to be satisfied as the conditions for the first storage state in the second storage mode to be transferred to the first storage state in the first storage mode.

$$Vfgr1 = Rcge \times Vr2 - Qfg1/Ctot \geq Vgh1$$

Formula 4

Here, Qfg1 on the left side of the inequality in Formula 4 is the amount of the charge in the floating gate FG in a state where no electrons are injected into the floating gate FG (first storage state in second storage mode) (the amount of negative charge), and the voltage Vfgr1 is the voltage of the first gate electrode 14 in the first storage state in the second storage mode.

As for the conditions for the storage state in the second storage mode to be the second storage state (state where electrons are injected into the floating gate FG) with no impact generated and for the storage state in the first storage mode to remain the second storage state as a result of initialization in the pre-recall process, it is necessary for the following Formula 5 to be satisfied, in order for the channel of the first MIS transistor 2 to disappear.

$$Vfgr2 = Rcge \times Vr2 - Qfg2/Ctot < Vthd2 \qquad \text{Formula 5}$$

Here, Qfg2 on the left side of the inequality in Formula 5 is the amount of charge in the floating gate FG in a state where electrons are injected into the floating gate FG (second storage state in second storage mode) (the amount of negative charge), and the voltage Vfgr2 is the voltage of the first gate electrode 14 in the second storage state in the second storage mode.

As described above, in the case where the second recall voltage Vr2 and the amounts of charge Qfg1 and Qfg2 stored in the floating gate FG in the respective storage states in the second storage mode are set so as to satisfy the inequalities in Formula 4 and Formula 5, the process for programming data "1" into the first MIS transistor 2 can be controlled in accordance with the amounts of charge Qfg1 and Qfg2 stored in the floating gate FG, so that it becomes possible for the storage state in the second storage mode to be transferred to the storage state in the first storage mode in accordance with the amounts of charge Qfg1 and Qfg2.

The above described main recall process is summarized in the table in FIG. 7. That is to say, in the case where the state is such that the first MIS transistor 2 is initialized, the storage state in the first storage mode is in the second storage state (data "0") and electrons are not injected into the floating gate FG, so that the amount of charge Qfg stored in the floating gate FG is the same or less than Qfg1 (first storage state in second storage mode, data "1"), the voltage Vfgr of the first gate electrode 14 becomes the same or higher than the voltage Vgh1 at which impact ions are generated in the first MIS transistor 2, thus causing holes to be injected into the first semiconductor layer 6, so that the process for programming data "1" into the first MIS transistor 2 is carried out and the storage state in the first storage mode becomes the first storage state.

Meanwhile, in the case where the state is such that the first MIS transistor 2 is initialized, the storage state in the first storage mode is in the second storage state (data "0") and electrons are injected into the floating gate FG, so that the amount of charge Qfg stored in the floating gate FG is the same or higher than Qfg2 (second storage state in second storage mode, data "0"), the voltage Vfgr of the first gate electrode 14 is the same or lower than the threshold voltage Vthd2 of the first MIS transistor 2 without a channel being formed, and therefore, holes are not injected into the first semiconductor layer 6 and the process for programming data "1" into the first MIS transistor 2 is not carried out, and thus, the storage state in the first storage mode is maintained at the second storage state (data "0").

As described above, the pre-recall process and the main recall process are carried out in order, so that the storage state in the second storage mode is transferred to the storage state in the first storage mode.

Here, the row decoder 26, the column decoder 27, the bit line voltage control circuit 28, the first word line voltage control circuit 29, the second word line voltage control circuit 30 and the source line voltage control circuit 31 work together, so that the first to third recall voltages Vr1 to Vr3 are applied during the above described pre-recall process and main recall process, and these circuits form a recall circuit for carrying out the pre-recall process and the main recall process during the recall process. Here, the recall circuit for the pre-recall process is the same circuit as the data writing circuit for the process for programming data "0."

Description of Storing Process

Figure 9:
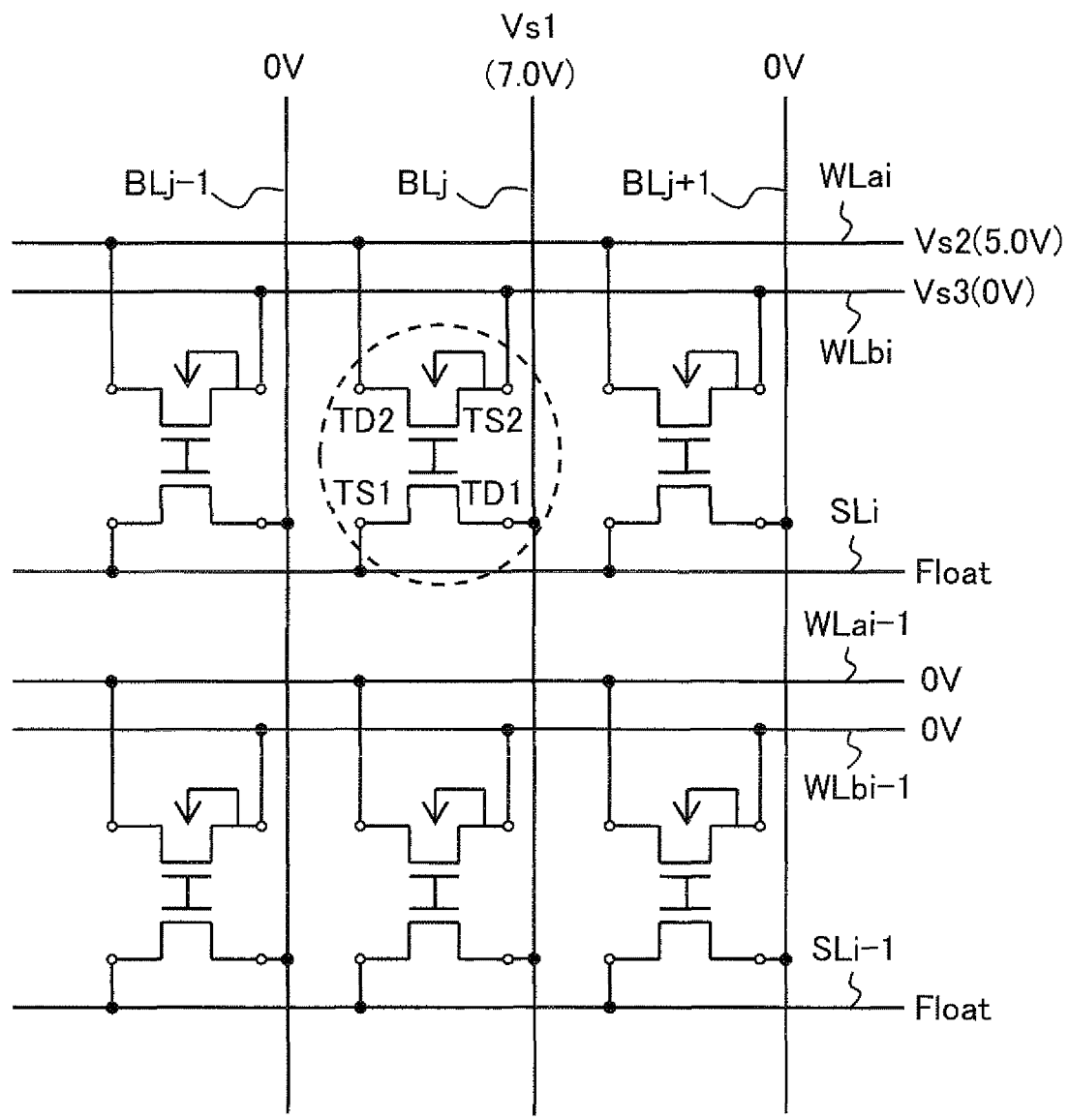
FIG. 9 is a circuit diagram showing a memory cell array in a state in which a voltage is applied in the case where a first storing process is carried out on a memory cell in the nonvolatile random access memory according to the present invention.
Figure 10:
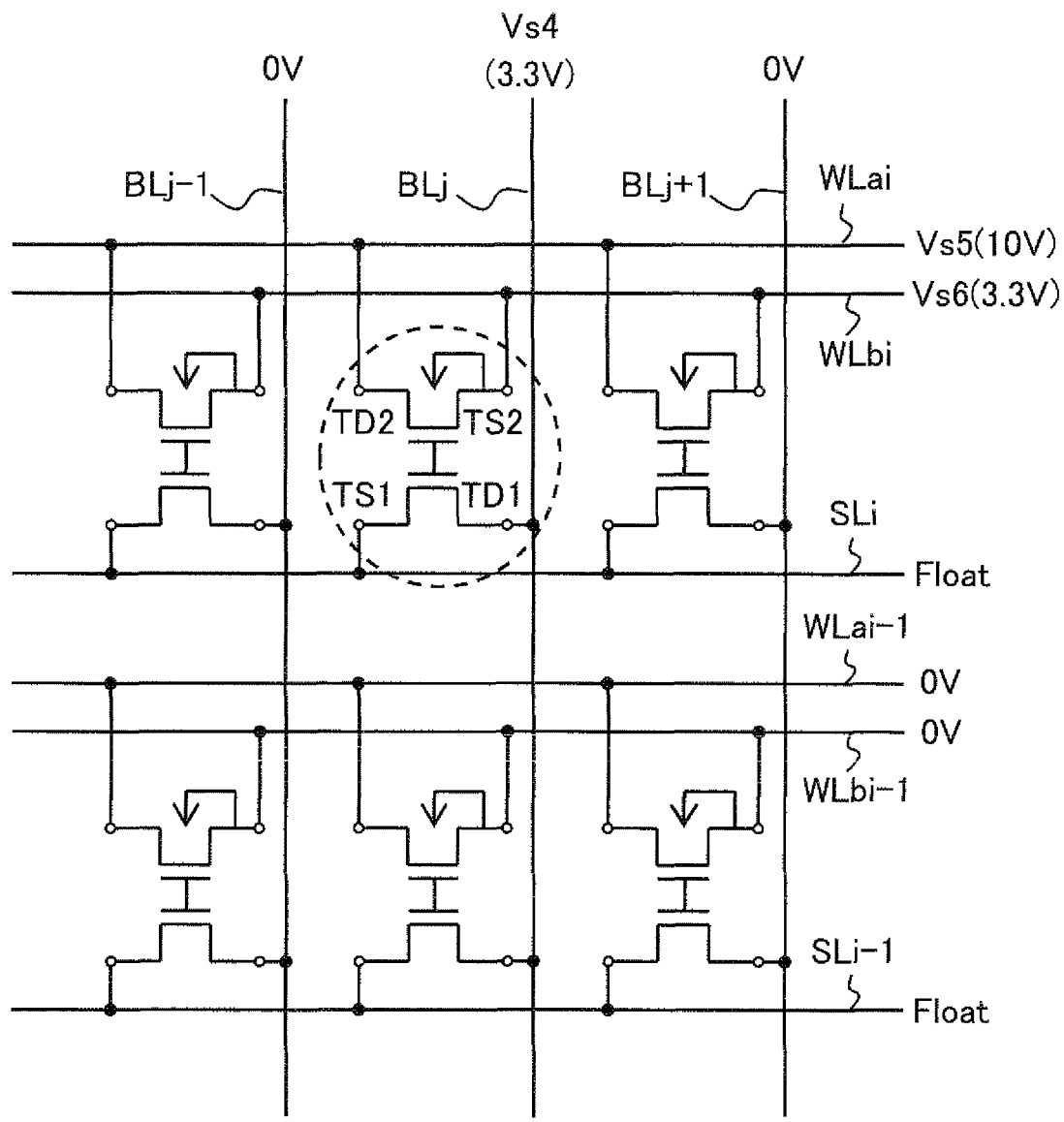
FIG. 10 is a circuit diagram showing a memory cell array in a state in which a voltage is applied in the case where a second storing process is carried out on a memory cell in the nonvolatile random access memory according to the present invention.

Next, the storing process, which is a process for transferring data from the storage state in the first storage mode to the storage state in the second storage mode, is described in reference to FIGS. 8 to 11. FIG. 9 is an equivalent circuit diagram showing the memory cell array in a state in which a voltage is applied during the below described first storing process that is carried out on the memory cell 1 on which the storing process is to be carried out, FIG. 10 is an equivalent circuit diagram showing the memory cell array in a state in which a voltage is applied in the below described second storing process that is carried out on the memory cell 1 on which the storing process is to be carried out, and FIG. 11 is a table showing the storage state in each part over time during the storing process.

The first storing process is a process for converting the first storage state in the first storage mode to the second storage state in the second storage mode, and the second storing process is a process for converting the second storage state in the first storage mode to the first storage state in the second storage mode. When the first staring process and the second storing process are carried out at random, the storage state in the first storage mode is transferred to the storage state in the second storage mode with data "0" and "1" inverted. In the following, the first storing process and the second storing process are described. Here, FIG. 11 shows an example of a case where the first storing process is carried out first, followed by the second storing process.

Description of First Storing Process

The first storing process is a process for injecting electrons into the second gate electrode 15 of the second MIS transistor 3 in the first storage state (data "1"), where holes are stored in the first semiconductor layer 6, so that the storage state in the second storage mode is converted to the second storage state.

As shown in FIG. 9, a positive first storing voltage Vs1 (for example 7.0 V) is applied to at least the bit line BLj or the source line SLi which is connected to the memory cell 1 on which the storing process is to be carried out, and a second storing voltage Vs2 (for example 5.0 V) and a third storing voltage Vs3 (for example 0 V) are respectively applied to the first word line WLai and the second word line WLbi which are connected to the memory cell 1 on which the storing process is to be carried out. Here, though in the present embodiment, all of the source lines SLi are in a floating state, and the first storing voltage Vs1 is applied only to the bit line BLj which is connected to the memory cell 1 on which storing process is to be carried out, in the case where a storing process is carried out row by row or array by array, the bit line BLj may be in a floating state, and the first storing voltage Vs1 may be applied only to the source line SLi row by row, or the first storing voltage Vs1 may be applied to all of the bit lines BLj and source lines SLi.

Here, the first MIS transistor 2 is in the first storage state (data "1"), in which holes are stored in the first semiconductor layer 6, and therefore, the threshold voltage Vthd1 of the first MIS transistor 2 is smaller than the threshold voltage Vthd2 of the second storage state (data "0"), in which no holes are stored in the first semiconductor layer 6. That is to say, Vthd1<Vthd2.

Meanwhile, in the first storage state, in which no electrons are injected into the second gate electrode 15 of the second MIS transistor 3, the voltage Vfgs1 of the second gate electrode 15 (floating gate FG) is calculated using Formula 6 below. In addition, Vbd, Vsd and Qfg1 in Formula 6 are respectively the voltage of the first semiconductor layer 6, the voltage of the first source region 10 and the amount of charge in the floating gate FG (the amount of negative charge).

$$Vfgs1 = Cde/Ctot \times Vs2 + Cse/Ctot \times Vs3 +$$
$$Cce/Ctot \times Vs3 + Cdd/Ctot \times Vs1 +$$
$$Ccd/Ctot \times Vbd + Csd/Ctot \times Vsd - Qfg1/Ctot$$

Formula 6

Here, the area where the first gate electrode 14 overlaps with the first drain region 8 and the first source region in the first MIS transistor 2 is sufficiently smaller than the area where the first gate electrode 14 overlaps with the first semiconductor layer 6, and the area where the second gate electrode 15 overlaps with the second drain region 9 and the second source region 11 in the second MIS transistor 3 is sufficiently smaller than the area where the second gate electrode 15 overlaps with the second semiconductor layer 7, and therefore, Formula 6 can be simplified to the following Formula 7, which represents the operation mechanism of the first storing process.

$$Vfgs1 = Cce/Ctot \times Vs3 + Ccd/Ctot \times Vbd - Qfg1/Ctot$$

Formula 7

The first storing process is a process for injecting electrons into the second gate electrode 15 of the second MIS transistor 3 in the first storage state (data "1"), in which holes are stored in the first semiconductor layer 6, so that the storage state in the second storage mode is converted to the second storage state, and therefore, the state shown in FIG. 11 as Case 1 is assumed. That is to say, it is assumed that the state before the first storing process is the first storage state, in which holes are stored in the first semiconductor layer 6, and no electrons are injected into the second gate electrode 15 of the second MIS transistor 3. When the voltage Vbd of the first semiconductor layer 6 rises to Vbd1 and the amount of charge Qfg1 stored in the floating gate FG is Qfg11 in the state before the first storing process, the voltage Vfgs11 of the first gate electrode 14 (floating gate FG) can be represented by Formula 8 below using the voltage Vbd1 of the first semiconductor layer 6. Here, Qfg11≤Qfg1.

In the following description of the first storing process and the second storing process, the first "1" or "2" in the two-digit figures following the voltage Vfgs and the amount of charge Qfg stored in the floating gate FG indicates whether the storage state in the first storage mode is the first storage mode or the second storage mode, and the second "1" or "2" indicates whether the storage state in the second storage mode is the first storage state or the second storage state. Here, the notations of the voltage Vfgs and the amount of charge Qfg stored in the floating gate FG are the same in both the first storing process and the second storing process when the storage states are the same in both storage modes, but the values are not necessarily the same. In addition, the one-digit figure "1" or "2" following the voltage Vbd of the first semiconductor layer 6 indicates whether the storage state in the first storage mode is the first storage state or the second storage state.

$$Vfgs11 = Cce/Ctot \times Vs3 + Ccd/Ctot \times Vbd1 - Qfg11/Ctot$$

Formula 8

In the case where the voltage Vfgs11 of the first gate electrode 14 is higher than the threshold voltage Vthd1 of the first MIS transistor 2, the surface of the first semiconductor layer 6 beneath the first gate electrode 14 of the first MIS transistor 2 becomes of an inverted state, and thus an inversion layer is formed.

Accordingly, the condition for forming the inversion layer is Vfgs11>Vthd1, and the conditional expression represented by Formula 9 below derives from Formula 8. In addition, the conditional expression represented by Formula 10 derives from Formula 9.

$$Vfgs11 = Cce/Ctot \times Vs3 + Ccd/Ctot \times Vbd1 - Qfg11/Ctot > Vthd1$$

Formula 9

$$(Cce/Ctot \times Vs3 + Ccd/Ctot \times Vbd1 - Vthd1) \times Ctot > Qfg11$$

Formula 10

When the amount of charge Qfg11 stored in the floating gate FG satisfies the conditional expression represented by Formula 9, an inversion layer is formed, and the first drain region 8 and the inversion layer are electrically connected, so that the voltage of the first gate electrode 14 rises to the voltage Vfgs11', as shown in Formula 11 below, through the capacitance coupling between the first storing voltage Vs1 applied to the first drain region 8 via the bit line BLj and the voltage Vfgs11 of the first gate electrode 14.

$$Vfgs11' = Cce/Ctot \times Vs3 + Ccd/Ctot \times Vbd1 - Qfg11/Ctot + (Ccd + Cdd)/Ctot \times Vs1$$

Formula 11

In the case where the amount of charge stored in the floating gate FG is lower than the amount of charge Qfg11 and the threshold voltage of the first MIS transistor 2 is lower than the threshold voltage Vthd1, the voltage Vfgs11' in the second gate electrode 15 (floating gate FG) is sufficiently high for generating hot carriers in the second MIS transistor 3 when appropriate values are selected for the first storing voltage Vs1 and the third storing voltage Vs3, so that hot carriers are generated in the vicinity of the second drain region 9 to which the second storing voltage Vs2 is applied and injected into the second gate electrode 15. As a result, the first storing process is carried out, so that the first storage state (data "1"), in which holes are stored in the first semiconductor layer 6, is converted to the second storage state (data "0") in the second storage mode, in which electrons are injected into the second gate electrode 15 of the second MIS transistor 3.

Next, how the first storing process is not carried out in the case where the state before the first storing process is the second storage state (data "0"), in which no holes are stored in the first semiconductor layer 6, under the same conditions for applying a voltage during the first storing process, and the second gate electrode 15 of the second MIS transistor 3 is in such a state that electrons are injected (second storage state) is described below (see Case 4 in FIG. 11).

In this case, no holes are stored in the first semiconductor layer 6, and the voltage Vbd lowers to the voltage Vbd2 (Vbd2<Vbd1), and furthermore, the threshold voltage of the first MIS transistor 2 rises from Vthd1 to Vthd2 (Vthd1<Vthd2).

Furthermore, the second gate electrode 15 (floating gate FG) is in such a state that electrons are injected (second storage state), and therefore, the voltage Vfgs22 can be calculated from Formula 12 below using the amount of stored charge Qfg22. Here, Qfg22>Qfg11.

$$Vfgs22 = Cce/Ctot \times Vs3 + Ccd/Ctot \times Vbd2 - Qfg22/Ctot$$

Formula 12

Here, as is clear when comparing Vfgs22 with the voltage Vfgs11 of the first gate electrode 14 in Formula 8, the voltage Vfgs22 of the first gate electrode 14 in Formula 12 does not satisfy the conditions for the surface of the first semiconductor layer 6 beneath the first gate electrode 14 to become of an inverted state, because Vbd2<Vbd1 and Vthd1<Vthd2, and therefore, there is no capacitance coupling between the first storing voltage Vs1 applied to the first drain region 8 and the voltage Vfgs22 of the first gate electrode 14, as in Formula 11, so that the voltage Vfgs22 of the first gate electrode 14 is prevented from rising. Accordingly, the storage state does not change in the second storage mode.

Next, how the first storing process is not carried out in the case where the state before the first storing process is the second storage state (data "0"), in which no holes are stored in the first semiconductor layer 6, under the same conditions for applying a voltage during the first storing process, and the second gate electrode 15 of the second MIS transistor 3 is in such a state that no electrons are injected (first storage state) is described (see Case 2 in FIG. 11).

In this case, as in Case 4, no holes are stored in the first semiconductor layer 6, and therefore, the voltage Vbd lowers to the voltage Vbd2 (Vbd2<Vbd1), and in addition, the threshold voltage of the first MIS transistor 2 rises from Vthd1 to Vthd2 (Vthd1<Vthd2).

Furthermore, the second gate electrode 15 (floating gate FG) is in such a state that no electrons are injected (first storage state), and therefore, the voltage Vfgs12 can be calculated from Formula 13 below using the amount of stored charge Qfg12. Here, Qfg12=Qfg11.

$$Vfgs12 = Cce/Ctot \times Vs3 + Ccd/Ctot \times Vbd2 - Qfg12/Ctot \quad \text{Formula 13}$$

Here, as is clear when comparing Vfgs12 with the voltage Vsgs11 of the first gate electrode 14 in Formula 8, the voltage Vfgs12 of the first gate electrode 14 in Formula 13 does not satisfy the conditions for the surface of the first semiconductor layer 6 beneath the first gate electrode 14 to become of an inverted state, because Vbd2<Vbd1 and Vthd1<Vthd2, and therefore, there is no capacitance coupling between the first storing voltage Vs1 applied to the first drain region 8 and the voltage Vfgs12 of the first gate electrode 14, as in Formula 11, so that the voltage Vfgs12 of the first gate electrode 14 is prevented from rising. Accordingly, the storage state does not change in the second storage mode.

Next, how the first storing process is not carried out in the case where the state before the first storing process is the first storage state (data "0"), in which holes are stored in the first semiconductor layer 6, under the same conditions for applying a voltage during the first storing process, and the second gate electrode 15 of the second MIS transistor 3 is in such a state that electrons are injected (second storage state) is described (see Case 3 in FIG. 11).

In this case, as in Case 1, holes are stored in the first semiconductor layer 6, and therefore, the voltage Vbd rises to the voltage Vhd1, and the threshold voltage of the first MIS transistor 2 lowers to Vthd1 (Vthd1<Vthd2). However, the second gate electrode 15 (floating gate FG) is in such a state that electrons are injected (second storage state), and therefore, the voltage Vfgs21 can be calculated from Formula 14 below using the amount of stored charge Qfg21.

$$Vfgs21 = Cce/Ctot \times Vs3 + Ccd/Ctot \times Vhd1 - Qfg21/Ctot \quad \text{Formula 14}$$

Here, as is clear when comparing Vfgs21 with the voltage Vfgs11 of the first gate electrode 14 in Formula 8, the voltage Vfgs21 of the first gate electrode 14 in Formula 14 does not satisfy the conditions for the surface of the first semiconductor layer 6 beneath the first gate electrode 14 to become of an inverted state, because Qfg21>Qfg11 and therefore Vfgs21<Vfgs11, and there is no capacitance coupling between the first storing voltage Vs1 applied to the first drain region 8 and the voltage Vfgs12 of the first gate electrode 14, as in Formula 11, so that the voltage Vfgs21 of the first gate electrode 14 is prevented from rising. Accordingly, the storage state does not change in the second storage mode.

FIG. 11 shows four cases, and as described in detail above, the first storing voltage Vs1 and the third storing voltage Vs3 are optimized to such values that an inversion layer is generated in Case 1, where an inversion layer is most easily generated in the first MIS transistor 2, and no inversion layer is generated in Cases 2 to 4.

Here, the row decoder 26, the column decoder 27, the bit line voltage control circuit 28, the first word line voltage control circuit 29, the second word line voltage control circuit 30 and the source line voltage control circuit 31 work together, so that the first to third storing voltages Vs1 to Vs3 can be applied in the above described first storing process, and these circuits form a first storing circuit for carrying out a first storing process at the time of the first storing.

Description of Second Storing Process

The second storing process is a process for drawing out electrons from the second gate electrode 15 of the second MIS transistor 3 or injecting holes into the second gate electrode 15 in the second storage state (data "0"), in which no holes are stored in the first semiconductor layer 6, so that the storage state in the second storage mode is converted to the first storage state.

As shown in FIG. 10, a positive fourth storing voltage Vs4 (for example 3.3 V) is applied at least to the bit line BLj or the source line SLi, which are connected to the memory cell 1 on which a storing process is carried out, a fifth storing voltage Vs5 (for example 10 V) which is higher than the fourth storing voltage Vs4 is applied to the first word line WLai which is connected to the memory cell 1 on which the storing process is to be carried out, and a sixth storing voltage Vs6 (for example 3.3 V) is applied to the second word line WLbi which is connected to the memory cell 1 on which the storing process is to be carried out. Here, though in the present embodiment, all of the source lines SLi are in a floating state and the fourth storing voltage Vs4 is applied only to the bit line BLj which is connected to the memory cell 1 on which the storing process is to be carried out, in the case where the storing process is carried out row by row or array by array, the fourth storing voltage Vs4 may be applied only to the source lines SLi row by row with the bit lines BLj in a floating state, or the fourth storing voltage Vs4 may be applied to all of the bit lines BLj and source lines SLi.

Here, the first MIS transistor 2 is in a second storage state (data "0"), in which no holes are stored in the first semiconductor layer 6, and therefore, the threshold voltage Vthd2 of the first MIS transistor 2 is greater than the threshold voltage Vthd1 in the first storage state (data "1"), in which holes are stored in the first semiconductor layer 6. That is to say, Vthd2>Vthd1.

Meanwhile, in the second storage state, in which electrons are injected into the second gate electrode 15 of the second MIS transistor 3, the voltage Vfgs2 of the second gate electrode 15 (floating gate FG) can be calculated from Formula 15 below, In addition, Vbd, Vsd and Qfg1 in Formula 15 are respectively the voltage of the first semiconductor layer 6, the voltage of the first source region 10 and the amount of charge in the floating gate FG (the amount of negative charge).

$$Vfgs2 = Cde/Ctot \times Vs5 + Cse/Ctot \times Vs6 + \\ Cce/Ctot \times Vs6 + Cdd/Ctot \times Vs4 + \\ Ccd/Ctot \times Vbd + Csd/Ctot \times Vsd - Qfg2/Ctot \quad \text{Formula 15}$$

Here, the area where the first gate electrode 14 overlaps with the first drain region 8 and the first source region in the first MIS transistor 2 is sufficiently smaller than the area where the first gate electrode 14 overlaps with the first semiconductor layer 6, and the area where the second gate electrode 15 overlaps with the second drain region 9 and the second source region 11 in the second MIS transistor 3 is sufficiently smaller than the area where the second gate electrode 15 overlaps with the second semiconductor layer 7, and therefore, Formula 15 can be simplified to Formula 15' below, which represents the operation mechanism in the second storing process.

$$Vfgs2=Cce/Ctot \times Vs6+Ccd/Ctot \times Vbd-Qfg2/Ctot \qquad \text{Formula 15'}$$

The second storing process is a process for drawing out electrons from or injecting holes into the second gate electrode 15 of the second MIS transistor 3 in the second storage state (data "0"), in which no holes are stored in the first semiconductor layer 6, so that the storage state in the second storage mode is converted to the first storage state, and therefore, in the state in Case 4 in FIG. 11 is assumed. That is to say, it is assumed that the state before the second storing process is the second storage state, in which no holes are stored in the first semiconductor layer 6, and electrons are injected into the second gate electrode 15 of the second MIS transistor 3. When the voltage Vbd of the first semiconductor layer 6 lowers to Vbd2 and the amount of charge Qfg2 stored in the floating gate FG is Qfg22 in the state before the second storing process, the voltage Vfgs22 of the first gate electrode 14 (floating gate FG) can be calculated from Formula 16 below using the voltage Vbd2 of the first semiconductor layer 6. Here, Qfg22 Qfg2.

$$Vfgs22=Cce/Ctot \times Vs6+Ccd/Ctot \times Vbd2-Qfg22/Ctot \qquad \text{Formula 16}$$

In the case where the voltage Vfgs22 of the first gate electrode 14 is lower than the threshold voltage Vthd2 of the first MIS transistor 2, the surface of the first semiconductor layer 6 beneath the first gate electrode 14 of the first MIS transistor 2 does not become of an inverted state, and no inversion layer is formed.

Accordingly, the condition for an inversion layer not to be formed is Vfgs22<Vthd2, and the conditional expression represented by Formula 17 below derives from Formula 16. In addition, the conditional expression represented by Formula 18 derives from Formula 17.

$$Vfgs22=Cce/Ctot \times Vs6+Ccd/Ctot \times Vbd2 Qfg221/Ctot \times Vthd2 \qquad \text{Formula 17}$$

$$(Cce/Ctot \times Vs6+Ccd/Ctot \times Vbd2-Vthd2) \times Ctot<Qfg22 \qquad \text{Formula 18}$$

The sixth storing voltage Vs6 is optimized so as to satisfy the above Formula 18 within a range of Qfg22>Qfg2.

In this case, the surface of the first semiconductor layer 6 of the first MIS transistor 2 does not become of an inverted state, and there is almost no capacitance coupling between the fourth storing voltage Vs4 applied to the first drain region 8 via the bit line BLj and the voltage Vfgs22 of the first gate electrode 14. As a result, the voltage Vfgs22 of the second gate electrode 15 (floating gate FG) is determined by the sixth storing voltage Vs6 and the voltage Vbd2 of the first semiconductor layer 6. The sixth storing voltage Vs6 and the voltage Vbd2 of the first semiconductor layer 6 are set to a positive voltage that is sufficiently lower than the fifth storing voltage Vs5 or 0 V, and therefore, the voltage Vfgs22 of the second gate electrode 15 does not rise. As a result, the fifth storing voltage Vs5, which is a high voltage, is applied to the second drain region 9 of the second MIS transistor 3 via the bit line BLj, so that a strong electrical field is generated through the second gate insulating film 13 between the second gate electrode 15, which is close to the ground voltage, and the second drain region 9. Accordingly, this strong electrical field draws out electrons from the second gate electrode 15 or injects holes into the second gate electrode 15, so that the state in which electrons are stored in the second gate electrode 15 changes. As a result, the second storing process is carried out, so that the second storage state (data "0"), in which no holes are stored in the first semiconductor layer 6, is converted to the first storage state (data "1") in the second storage mode, in which no electrons are injected into the second gate electrode 15 of the second MIS transistor 3.

Next, how the second storing process is not carried out in the case where the state before the second storing process is the second storage state (data "0"), in which no holes are stored in the first semiconductor layer 6, under the same conditions for applying a voltage during the second storing process, and the second gate electrode 15 of the second MN transistor 3 is such a state that no electrons are injected (first storage state) is described (see Case 2 in FIG. 11).

In this case, no holes are stored in the first semiconductor layer 6, and therefore the voltage Vbd lowers to the voltage Vbd2 (Vbd2<Vhd1), and furthermore, the threshold voltage of the first MIS transistor 2 rises from Vthd1 to Vthd2 (Vthd1<Vthd2).

Furthermore, the second gate electrode 15 (floating gate FG) is in such a state that no electrons are injected (first storage state), and therefore, the voltage Vfgs12 can be calculated from Formula 19 below using the amount of stored charge Qfg12. Here, Qfg12<Qfg22, $$Vfgs12=Cce/Ctot \times Vs6+Ccd/Ctot \times Vbd2-Qfg12/Ctot \qquad \text{Formula 19}$$

Here, as is clear when comparing the voltage Vfgs12 with the voltage Vfgs22 of the first gate electrode 14 in Formula 16, the conditions for preventing the surface of the first semiconductor layer 6 beneath the first gate electrode 14 in Formula 17 are not satisfied, because Qfg12<Qfg22, and therefore, Vfgs12>Vfgs22, so that the surface of the first semiconductor layer 6 is inverted and an inversion layer is formed. Accordingly, the first drain region 8 and the inversion layer are electrically connected, so that there is capacitance coupling between the fourth storing voltage Vs4 applied to the first drain region 8 via the bit line BLj and the voltage Vfgs12 of the first gate electrode 14, and the voltage of the first gate electrode 14 rises to the voltage Vfgs12', as in Formula 20 below.

$$Vfgs12'=Cce/Ctot \times Vs6+Ccd/Ctot \times Vbd2-Qfg12/Ctot+ (Ccd+Cdd)/Ctot \times Vs4 \qquad \text{Formula 20}$$

As a result, the voltage of the second gate electrode 15 rises, and the fifth storing voltage Vs5, which is a high voltage, is applied to the second drain region 9 of the second MIS transistor 3 via the bit line BLj, but the difference in the voltage from the voltage Vfgs12' of the second gate electrode 15 after it has risen becomes smaller, and therefore, no strong electrical field is generated through the second gate insulating film 13 between the second gate electrode 15 and the second drain region 9. Accordingly, there is no electrical field to draw out electrons from the second gate electrode 15 or inject holes into the second gate electrode 15, and thus, the state where electrons are not injected into the second gate electrode 15 can be maintained. Accordingly, the storage state does not change in the second storage mode.

Next, how the second storing process is not carried out in the case where the state before the second storing process is the first storage state (data "0"), in which holes are stored in the first semiconductor layer 6, under the same conditions for the voltage to be applied during the second storing process, and the second gate electrode 15 of the second MIS transistor 3 is in such a state that no electrons are injected (first storage state) is described (see Case 1 in FIG. 11).

In this case, holes are stored in the first semiconductor layer 6, and therefore, the voltage Vbd rises to the voltage Vbd1 and the threshold voltage of the first MIS transistor 2 lowers to Vthd1 (Vthd1<Vthd2). Furthermore, the second gate electrode 15 (floating gate FG) is in such a state that no electrons are injected (first storage state), and therefore, the voltage Vfgs11 can be calculated from Formula 21 below using the amount of stored charge Qfg11.

$$Vfgs11 = Cce/Ctot \times Vs6 + Ccd/Ctot \times Vbd1 - Qfg11/Ctot \quad \text{Formula 21}$$

Accordingly, the voltage Vfgs11 of the second gate electrode 15 (floating gate FG) is higher than the voltage Vfgs12 of the second gate electrode 15 (floating gate FG) in the above described Case 2 in Formula 19, so that the surface of the first semiconductor layer 6 beneath the first gate electrode 14 is inverted and an inversion layer is formed. Accordingly, the first drain region 8 and the inversion layer are electrically connected, so that there is capacitance coupling between the fourth storing voltage Vs4 applied to the first drain region 8 via the bit line BLj and the voltage Vfgs11 of the first gate electrode 14, and the voltage of the first gate electrode 14 rises to the voltage Vfgs11', as shown in Formula 22 below.

$$Vfgs11' = Cce/Ctot \times Vs6 + Ccd/Ctot \times Vbd1 - Qfg11/Ctot + (Ccd+Cdd)/Ctot \times Vs4 \quad \text{Formula 22}$$

As a result, the voltage of the second gate electrode 15 rises, and the fifth storing voltage Vs5, which is a high voltage, is applied to the second drain region 9 of the second MIS transistor 3 via the bit line BLj, but the difference in the voltage with the voltage Vfgs11' of the second gate electrode 15 after the voltage has risen becomes smaller, and therefore, no strong electrical field is generated through the second gate insulating film 13 between the second gate electrode 15 and the second drain region 19. Accordingly, there is no electrical field to draw out electrons from the second gate electrode 15 or inject holes into the second gate electrode 15, and thus, the state in which electrons are not injected into the second gate electrode 15 can be maintained. Accordingly, the storage state does not change in the second storage mode.

Next, how the second storing process is not carried out in the case where the state before the second storing process is the first storage state (data "0"), in which holes are stored in the first semiconductor layer 6, under the same conditions for the voltage to be applied during the second storing process, and the second gate electrode 15 of the second MIS transistor 3 is in such a state that electrons are injected (second storage state) is described (see Case 3 in FIG. 11).

In this case, as in Case 1, holes are stored in the first semiconductor layer 6, and therefore, the voltage Vbd rises to the voltage Vbd1 and the threshold voltage of the first MIS transistor 2 lowers to Vthd1 (Vthd1<Vthd2). However, the second gate electrode 15 (floating gate FG) is in such a state that electrons are injected (second storage state), and therefore, the voltage Vfgs21 can be calculated from Formula 23 below using the amount of stored charge Qfg21.

$$Vfgs21 = Cce/Ctot \times Vs6 + Ccd/Ctot \times Vbd1 - Qfg21/Ctot \quad \text{Formula 23}$$

Here, as is clear when comparing the voltage Vfgs21 with the voltage Vfgs22 of the first gate electrode 14 in Formula 16, the conditions for preventing the surface of the first semiconductor layer 6 beneath the first gate electrode 14 in Formula 17 are not satisfied, because Vbd1>Vbd2, though Qfg12=Qfg22, and therefore, Vfgs21>Vfgs22, so that the surface of the first semiconductor layer 6 is inverted and an inversion layer is formed. Accordingly, the first drain region 8 and the inversion layer are electrically connected, so that there is capacitance coupling between the fourth storing voltage Vs4 applied to the first drain region 8 via the bit line BLj and the voltage Vfgs21 of the first gate electrode 14, and the voltage of the first gate electrode 14 rises to the voltage Vfgs21', as in Formula 24 below.

$$Vfgs21' = Cce/Ctot \times Vs6 + Ccd/Ctot \times Vbd1 - Qfg21/Ctot + (Ccd+Cdd)/Ctot \times Vs4 \quad \text{Formula 24}$$

As a result, the voltage of the second gate electrode 15 rises, and the fifth storing voltage Vs5, which is a high voltage, is applied to the second drain region 9 of the second MIS transistor 3 via the bit line BLj, but the difference in the voltage with the voltage Vfgs21' of the second gate electrode 15 after it has risen becomes smaller, and therefore, no strong electrical field is generated through the second gate insulating film 13 between the second gate electrode 15 and the second drain region 9. Accordingly, there is no electrical field to draw out electrons from the second gate electrode 15 or inject holes into the second gate electrode 15, and thus, the state where electrons are injected into the second gate electrode 15 can be maintained. Accordingly, the storage state does not change in the second storage mode.

As described in detail above, the fourth storing voltage Vs4 and the sixth storing voltage Vs6 do not generate an inversion layer in Case 4, where it is most difficult for an inversion layer to be created in the first MIS transistor 2 from among the four cases shown in FIG. 11, and are optimized to such values that an inversion layer is created in Cases 1 to 3.

Here, the row decoder 26, the column decoder 27, the bit line voltage control circuit 28, the first word line voltage control circuit 29, the second word line voltage control circuit 30 and the source line voltage control circuit 31 work together, so that the fourth to sixth storing voltages Vs4 to Vs6 are applied in the above described second storing process, and these circuits form a second storing circuit for carrying out a second storing process at the time of the second storing.

The first storing process and the second storing process are described in detail above, and when the first storing process and the second storing process are carried out at random, the storage state in the first storage mode transfers to the storage state in the second storage mode with the data "0" and "1" switched.

Here, in the case where the storage state either in the first storage mode or the second storage mode and the data "0" or "1" is switched, the inversion of the data "0" and "1" in the above described storing process is reversed. However, the data "0" and "1" is inverted during the above described recall process. That is to say, when the recall process and the storing process are carried out, the data "0" and "1" is inverted either in the recall process or the storing process, irrespectively of the relationship between the storage state and the data "0" and "1."

Accordingly, in the present embodiment, after the recall circuit completes the recall process, the first data writing circuit carries out a data inverting process for inverting the storage state in the first storage mode on the memory cells after the recall process, before starting an usual readout process. Concretely, the first data readout circuit reads out the storage state in the first storage mode, no refreshing process is carried out, but data that is read out is inverted, and the first data writing circuit carries out a programming process on the same memory cell. The readout process and the programming process are described above, and the descriptions that are the same are not repeated.

Alternatively, the first data readout circuit may read out the storage state in the first storage mode before carrying out the above described storing process instead of carrying out the above described data inverting process after the recall process, no refreshing process may be carried out but instead data that is read out inverted, and the first data writing circuit may carry out a programming process on the same memory cell.

Description of Initialization Process for Storage State in Second Storage Mode

Figure 12:
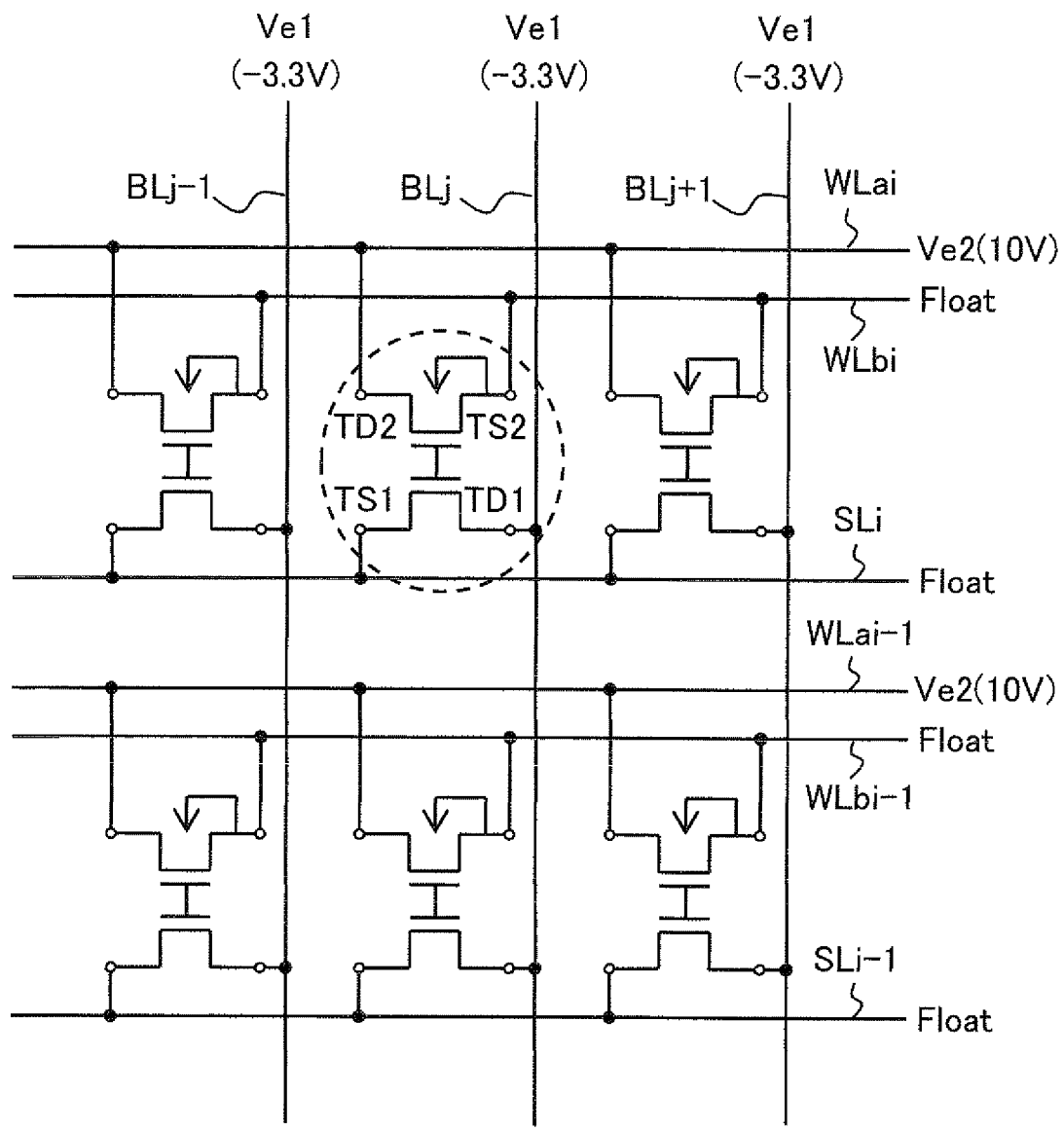
FIG. 12 is a circuit diagram showing a memory cell array in a state in which a voltage is applied in the case where a process for resetting the storage state in the second storage mode is carried out on a memory cell in the nonvolatile random access memory according to the present invention.
Figure 13:
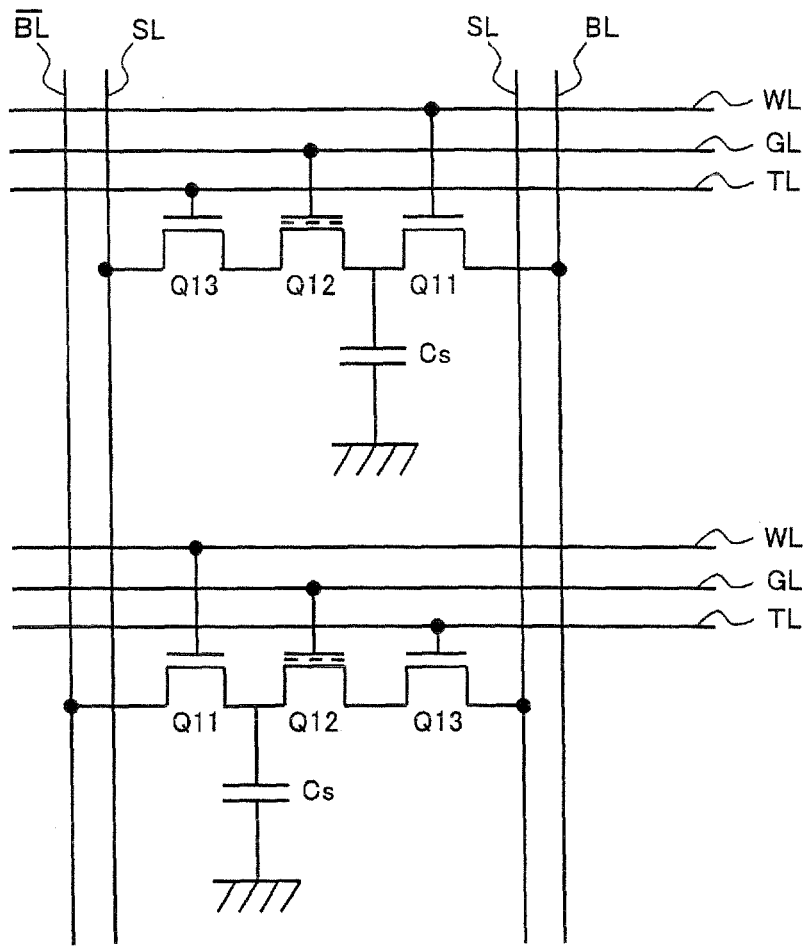
FIG. 13 is an equivalent circuit diagram showing memory cells in a conventional nonvolatile dynamic random access memory.
Figure 14:
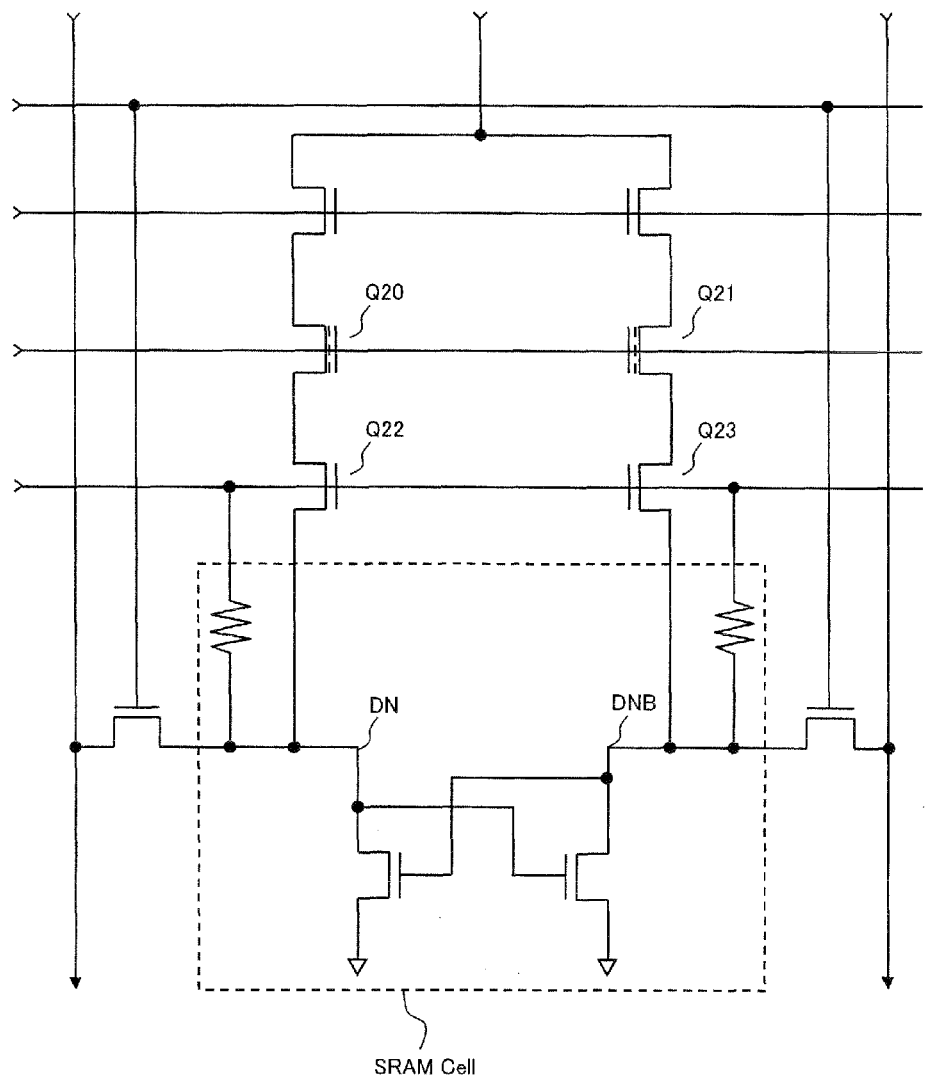
FIG. 14 is an equivalent circuit diagram showing a memory cell in a conventional nonvolatile static random access memory.

Next, a resetting process for directly initializing the storage state in the second storage mode of the memory cells 1 to the first storage state without using the above described storing process is described in reference to FIG. 12. Here, though in the present embodiment, a case where a resetting process is collectively carried out on all of the memory cells 1 in the memory cell array 21, it is possible to carry out the resetting process row by row or column by column.

As shown in FIG. 12, a negative first resetting voltage Ve1 (for example −3.3 V) is applied to at least the bit line BLj or the source line SLi connected to the memory cell 1 on which the resetting process is to be carried out, and a second resetting voltage Ve2, which is a high voltage having a positive polarity (for example 10V) is applied to the first word line WLai which is connected to the memory cell 1 on which the resetting process is to be carried out. All of the second word lines WLbi are in a floating state. Here, though in the present embodiment all of the source lines SLi are in a floating state and the first resetting voltage Ve1 is applied only to the bit line BLj which is connected to the memory cell 1 on which the resetting process is to be carried out, in the case where the resetting process is carried out row by row or array by array, the bit lines BLj may be in a floating state and the first resetting voltage Ve1 may be applied only to the source lines SLi row by row, or the first resetting voltage Ve1 may be applied to all of the bit lines BLj and source lines SLi.

As a result of the above application of the first resetting voltage Ve1 and the second resetting voltage Ve2, a negative first resetting voltage Ve1 is applied to the first drain region 8 of the first MIS transistor 2 via the bit line BLj, and therefore, the first semiconductor layer 6 and the first drain region 8 are in a forward direction bias state, and a negative first resetting voltage Ve1 is also applied to the first semiconductor layer 6, so that there is capacitance coupling with the first gate electrode 14, and thus the voltage of the first gate electrode 14 (floating gate FG) lowers in a negative direction. As a result, a strong electrical field is generated between the second gate electrode 15 in such a state that a negative voltage is applied and the second drain region 9 to which a high second reset voltage Ve2 is applied via the first word line WLai, and therefore, electrons stored in the second gate electrode 15 are drawn out or holes injected into the second gate electrode 15, so that the state in which electrons are stored in the second gate electrode 15 changes, and the storage state in the second storage mode is converted to the first storage state.

Here, the row decoder 26, the column decoder 27, the bit line voltage control circuit 28, the first word line voltage control circuit 29, the second word line voltage control circuit 30 and the source line voltage control circuit 31 work together, so that the first and second resetting voltages Ve1 and Ve2 are applied in the above described resetting process, and these circuits form a resetting circuit for carrying out a resetting process at the time of the resetting process.

In addition, in the case where the first resetting voltage Ve1 is the ground voltage, a second resetting voltage Ve2, which is high enough to be able to generate an electrical field that is as strong as that described above can be supplied between the second gate electrode 15 and the second drain region 9, so that electrons stored in the second gate 15 are drawn out and a resetting process can be carried out as described above. However, in this case, it is mostly difficult to secure a margin for the withstand voltage in the junction between the second drain region 9 and the second semiconductor layer across which the second resetting voltage Ve2 is applied, and therefore, it is preferable for the applied first resetting voltage Ve1 to be negative.

Other Embodiments (1) Though in the above described embodiments the memory cells 1 are formed on an SOI substrate; that is to say, the first semiconductor layer 6 and the second semiconductor layer 7 are both formed on a silicon oxide film layer 5 (insulator substrate), the memory cells 1 may be formed on an N type impurity diffusion layer in a structure where the potential is set so that the junctions between the first semiconductor layer 6 and the N type impurity diffusion layer and between the second semiconductor layer 7 and the N type impurity diffusion layer are in a backward direction bias state.

(2) In addition, though in the above described embodiments, the first semiconductor layer 6 and the second semiconductor layer 7 are both formed of a P type silicon layer, the first semiconductor layer 6 and the second semiconductor layer 7 may be formed of an N type silicon layer, so that the first MIS transistor 2 and the second MIS transistor 3 are formed of P type MIS transistors. In this case, the polarity of the voltage applied in the above described processes may be inverted.

INDUSTRIAL APPLICABILITY

The present invention is applicable to nonvolatile random access memories which can be mounted on a substrate during a standard CMOS process.

The invention claimed is:

1. A nonvolatile random access memory having a nonvolatile memory cell storing one-bit data, wherein
   the memory cell comprises:
   a first Metal-Insulator-Semiconductor (MIS) transistor formed of a first semiconductor layer of a first conductivity type which is in an electrically floating state, a first drain region and a first source region made of an impurity diffusion region of a second conductivity type that is opposite to the first conductivity type formed on a surface of the first semiconductor layer, and a first gate electrode formed through a first gate insulating film over the surface of the first semiconductor layer between the first drain region and the first source region; and
   a second MIS transistor formed of a second semiconductor layer of the first conductivity type that is isolated from the first semiconductor layer, a second drain region and second source region made of an impurity diffusion region of the second conductivity type formed on a surface of the second semiconductor layer, a second gate electrode formed through a second gate insulating film over the surface of the second semiconductor layer between the second drain region and the second source region,
   the first gate electrode and the second gate electrode are electrically connected to each other so as to form a floating gate in an electrically floating state,
   one-bit date is stored in a volatile manner by controlling a threshold voltage of the first MIS transistor in accordance with an amount of charge in the first semiconductor layer in a first storage mode, and
   one-bit data is stored in a nonvolatile manner by controlling a threshold voltage of the second MIS transistor in accordance with an amount of charge in the floating gate in a second storage mode.

2. The nonvolatile random access memory according to claim 1, further comprising
a contact region comprising an impurity diffusion region of the first conductivity type for supplying a voltage to the second semiconductor layer made of an impurity diffusion region of the first conductivity type on the surface of the second semiconductor layer, wherein
the contact region and the second source region are electrically connected so as to have a same potential.

3. The nonvolatile random access memory according to claim 1, further comprising
a first data writing circuit arranged to write a storage state in the first storage mode, wherein
the first data writing circuit applies a first programming voltage with a positive polarity to the first drain region with the first source region as a reference if the first conductivity type is a P type, and the first programming voltage with a negative polarity if the first conductivity type is an N type, and applies a second programming voltage with a same polarity as that of the first programming voltage determined in accordance with the first conductivity type to at least one of the second drain region, the second source region and the second semiconductor layer in order to control a voltage of the first gate electrode through capacitance coupling between the second gate electrode and at least any one of the second drain region, the second source region and the second semiconductor layer, so that impact icons are generated in a vicinity of the first drain region, a positive charge is stored within the first semiconductor layer if the first conductivity is the P type, and a negative charge is stored within the first semiconductor layer if the first conductivity type is the N type, and the storage state in the first storage mode is changed to a first storage state, and
the first data writing circuit applies a third programming voltage having a polarity opposite to that of the first programming voltage to the first drain region with the first source region as a reference, so that a junction between the first drain region and the first semiconductor layer becomes of a forward-direction bias state, a charge stored in the first semiconductor layer is released to the first drain region, and the storage state in the first storage mode is changed to a second storage state.

4. The nonvolatile random access memory according to claim 3, further comprising
a first data readout circuit arranged to read out the storage state in the first storage mode, wherein
the first data readout circuit applies a first readout voltage to the first drain region, the first readout voltage having a positive polarity if the first conductivity type is the P type and a negative polarity if the first conductivity type is the N type with the first source region as a reference, and applies a second readout voltage to at least any one of the second drain region, the second source region and the second semiconductor layer, the second readout voltage having a positive polarity if the first conductivity type is the P type and a negative polarity if the first conductivity type is the N type with the first source region as a reference, in order to control the voltage of the first gate electrode through capacitance coupling between the second gate electrode and at least any one of the second drain region, the second source region and the second semiconductor layer, so that a difference in a threshold voltage of the first MIS transistor determined in accordance with an amount of charge in the first semiconductor layer is detected as a difference in current between the first drain region and the first source region, and it is detected whether the storage state in the first storage mode is the first storage state or the second storage state.

5. The nonvolatile random access memory according to claim 3, further comprising
a recall circuit arranged to carry out a recall process in which the storage state in the second storage mode is transferred to the storage state in the first storage mode, wherein
the recall circuit applies a first recall voltage to the first drain region, the first recall voltage having a positive polarity if the first conductivity type is the P type and a negative polarity if the first conductivity type is the N type with the first source region as a reference, and applies a second recall voltage to at least any one of the second drain region, the second source region and the second semiconductor layer, the second recall voltage having a positive polarity if the first conductivity type is the P type and a negative polarity if the first conductivity type is the N type with the first source region as a reference, in order to control the voltage of the first gate electrode through capacitance coupling between the second gate electrode and at least any one of the second drain region, the second source region and the second semiconductor layer, so that generation of impact ions in the vicinity of the first drain region is controlled in response to change in the voltage of the first gate electrode in accordance with the storage state in the second storage mode, and the storage state of the second storage is transferred to the storage state of the first storage mode which depends on the amount of charge in the first semiconductor layer.

6. The nonvolatile random access memory according to claim 4, further comprising
a recall circuit arranged to carry out a recall process in which the storage state in the second storage mode is transferred to the storage state in the first storage mode, wherein
the recall circuit applies a first recall voltage to the first drain region, the first recall voltage having a positive polarity if the first conductivity type is the P type and a negative polarity if the first conductivity type is the N type with the first source region as a reference, and applies a second recall voltage to at least any one of the second drain region, the second source region and the second semiconductor layer, the second recall voltage having a positive polarity if the first conductivity t e is the P type and a negative polarity if the first conductivity is the N type with the first source region as a reference, in order to control the voltage of the first gate electrode through capacitance coupling between the second gate electrode and at least any one of the second drain region, the second source region and the second semiconductor layer, so that generation of impact ions in the vicinity of the first drain region is controlled in response to change in the voltage of the first gate electrode in accordance with the storage state in the second storage mode, and the storage state of the second storage mode is transferred to the storage state of the first storage mode which depends on the amount of charge in the first semiconductor layer.

7. The nonvolatile random access memory according to claim 5, wherein
the recall circuit carries out an initialization process by applying a third recall voltage having a polarity opposite to that of the first recall voltage to the first drain region with the first source region as a reference before applying the first recall voltage and the second recall voltage so that a junction between the first drain region and the first semiconductor layer becomes of a forward-direction bias state, and wherein a charge stored in the first semiconductor layer is released to the first drain region, and the storage state in the first storage mode is changed to the second storage state.

8. The nonvolatile random access memory according to claim 3, further comprising a first storing circuit arranged to carry out a first storing process in which the first storage state in the first storage mode is transferred to the storage state in the second storage mode, wherein when the storage state in the first storage mode is the first storage state, the first storing circuit applies: a positive first storing voltage to at least the first drain region or the first source region when the first conductivity type is the P type and a negative first storing voltage when the first conductivity type is the N type so that an inversion layer is generated beneath the first gate electrode; a second storing voltage of a same polarity as the first storing voltage to the second drain region; and a third storing voltage of the same polarity as the first storing voltage to the second source region and the second semiconductor layer, in order to control a voltage of the second gate electrode through capacitance coupling between the first gate electrode and at least the first drain region or the first source region together with the inversion layer, so that hot carriers are generated in either the second drain region or the second source region, a charge having a polarity opposite to that of a charge stored in the first semiconductor layer is injected into the floating gate, and the first storage state in the first storage mode is transferred to the storage state in the second storage mode.

9. The nonvolatile random access memory according to claim 4, further comprising a first storing circuit arranged to carry out a first storing process in which the first storage state in the first storage mode is transferred to the storage state in the second storage mode, wherein when the storage state in the first storage mode is the first storage state, the first storing circuit applies: a positive first storing voltage to at least the first drain region or the first source region when the first conductivity type is the P type and a negative first storing voltage when the first conductivity type is the N type so that an inversion layer is generated beneath the first gate electrode; a second storing voltage of a same polarity as the first storing voltage to the second drain region; and a third storing voltage of the same polarity as the first storing voltage to the second source region and the second semiconductor layer, in order to control a voltage of the second gate electrode through capacitance coupling between the first gate electrode and at least the first drain region or the first source region together with the inversion layer, so that hot carriers are generated in either the second drain region or the second source region, a charge having a polarity opposite to that of a charge stored in the first semiconductor layer is injected into the floating gate, and the first storage state in the first storage mode is transferred to the storage state in the second storage mode.

10. The nonvolatile random access memory according to claim 5, further comprising a first storing circuit arranged to carry out a first storing process in which the first storage state in the first storage mode is transferred to the storage state in the second storage mode, wherein when the storage state in the first storage mode is the first storage state, the first storing circuit applies: a positive first storing voltage to at least the first drain region or the first source region when the first conductivity type is the P type and a negative first storing voltage when the first conductivity type is the N type so that an inversion layer is generated beneath the first gate electrode; a second storing voltage of a same polarity as the first storing voltage to the second drain region; and a third storing voltage of the same polarity as the first storing voltage to the second source region and the second semiconductor layer, in order to control a voltage of the second gate electrode through capacitance coupling between the first gate electrode and at least the first drain region or the first source region together with the inversion layer, so that hot carriers are generated in either the second drain region or the second source region, a charge having a polarity opposite to that of a charge stored in the first semiconductor layer is injected into the floating gate, and the first storage state in the first storage mode is transferred to the storage state in the second storage mode.

11. The nonvolatile random access memory according to claim 6, further comprising a first storing circuit arranged to carry out a first storing process in which the first storage state in the first storage mode is transferred to the storage state in the second storage mode, wherein when the storage state in the first storage mode is the first storage state, the first storing circuit applies: a positive first storing voltage to at least the first drain region or the first source region when the first conductivity type is the P type and a negative first storing voltage when the first conductivity type is the N type so that an inversion layer is generated beneath the first gate electrode; a second storing voltage of a same polarity as the first storing voltage to the second drain region; and a third storing voltage of the same polarity as the first storing voltage to the second source region and the second semiconductor layer, in order to control a voltage of the second gate electrode through capacitance coupling between the first gate electrode and at least the first drain region or the first source region together with the inversion layer, so that hot carriers are generated in either the second drain region or the second source region, a charge having a polarity opposite to that of a charge stored in the first semiconductor layer is injected into the floating gate, and the first storage state in the first storage mode is transferred to the storage state in the second storage mode.

12. The nonvolatile random access memory according to claim 8, further comprising a second storing circuit arranged to carry out a second storing process in which the second storage state in the first storage mode is transferred to the storage state in the second storage mode, wherein when the storage state in the first storage mode is the second storage state, the second storing circuit applies: a fourth storing voltage having the same polarity as the first storing voltage to at least the first drain region or the first source region so that no inversion layer is generated beneath the first gate electrode; a fifth storing voltage having the same polarity as the fourth storing voltage to the second drain region; and a sixth storing voltage having the same polarity as the fourth storing voltage to the second source region and the second semiconductor layer, in order to control the voltage of the second gate electrode through capacitance coupling between the first gate and at least the first drain region or the first source region, so that hot carriers having a polarity opposite to that of the hot carriers in the first storing process are generated in either the second drain region or the second source region, a charge having a same polarity as the charge stored in the first semiconductor layer is injected into the floating gate, and the second storage state in the first storage mode is transferred to the storage state in the second storage mode.

13. The nonvolatile random access memory according to claim 5,
wherein the first data writing circuit carries out a data inversion process, in which the storage state in the first storage mode is inverted, after the recall circuit completes the recall process.

14. The nonvolatile random access memory according to claim 12,
wherein the first data writing circuit carries out a data inversion process, in which the storage state in the first storage mode is inverted, before the first storing circuit carries out the first storing process and the second storing circuit carries out the second storing process.

15. The nonvolatile random access memory according to claim 3, further comprising
a reset circuit arranged to initialize the storage state in the second storage mode, wherein
the reset circuit applies a first reset voltage or a ground voltage to one of the first drain region and the first source region with the other of the first drain region and the first source region in a floating state, the first reset voltage having a negative polarity if the first conductivity type is the P type and a positive polarity if the first conductivity type is the N type with the first semiconductor layer as a reference, and applies a second reset voltage to the second drain region with the second source region and the second semiconductor layer in a floating state, the second reset voltage having a positive polarity if the first conductivity type is the P type and a negative polarity if the first conductivity e is the N type with the first semiconductor layer as a reference, in order to control a voltage of the second gate electrode through capacitance coupling between the first gate electrode and the one of the first drain region and the first source region to which the first reset voltage is applied, so that a charge stored in the floating gate is drawn out or a charge having a polarity opposite to that of the charge stored in the floating gate is injected, due to a voltage between the second gate electrode and the second drain region, and a state in which a charge is stored in the floating gate is initialized.

16. The nonvolatile random access memory according to claim 4, further comprising
a reset circuit arranged to initialize the storage state in the second storage mode, wherein
the reset circuit applies a first reset voltage or a ground voltage to one of the first drain region and the first source region, the first reset voltage having a negative polarity if the first conductivity type is the P type and a positive polarity if the first conductivity type is the N type, and applies a second reset voltage to the second drain region with the second source region and the second semiconductor layer in a floating state, the second reset voltage having a positive polarity if the first conductivity type is the P type and a negative polarity if the first conductivity type is the N type with the first semiconductor layer as a reference, in order to control a voltage of the second gate electrode through capacitance coupling between the first gate electrode and the one of the first drain region and the first source region to which the first reset voltage is applied, so that a charge stored in the floating gate is drawn out or a charge having a polarity opposite to that of the charge stored in the floating gate is injected, due to a voltage between the second gate electrode and the second drain region, and a state in which a charge is stored in the floating gate is initialized.

17. The nonvolatile random access memory according to claim 5, further comprising
a reset circuit arranged to initialize the storage state in the second storage mode, wherein
the reset circuit applies a first reset voltage or a ground voltage to one of the first drain region and the first source region, the first reset voltage having a negative polarity if the first conductivity type is the P type and a positive polarity if the first conductivity type is the N type, and applies a second reset voltage to the second drain region with the second source region and the second semiconductor layer in a floating state, the second reset voltage having a positive polarity if the first conductivity type is the P type and a negative polarity if the first conductivity type is the N type with the first semiconductor layer as a reference, in order to control a voltage of the second gate electrode through capacitance coupling between the first gate electrode and the one of the first drain region and the first source region to which the first reset voltage is applied, so that a charge stored in the floating gate is drawn out or a charge having a polarity opposite to that of the charge stored in the floating gate is injected, due to a voltage between the second gate electrode and the second drain region, and a state in which a charge is stored in the floating gate is initialized.

18. The nonvolatile random access memory according to claim 6, further comprising
a reset circuit arranged to initialize the storage state in the second storage mode, wherein
the reset circuit applies a first reset voltage or a ground voltage to one of the first drain region and the first source region, the first reset voltage having a negative polarity if the first conductivity type is the P type and a positive polarity if the first conductivity type is the N type, and applies a second reset voltage to the second drain region with the second source region and the second semiconductor layer in a floating state, the second reset voltage having a positive polarity if the first conductivity type is the P type and a negative polarity if the first conductivity type is the N type with the first semiconductor layer as a reference, in order to control a voltage of the second gate electrode through capacitance coupling between the first gate electrode and the one of the first drain region and the first source region to which the first reset voltage is applied, so that a charge stored in the floating gate is drawn out or a charge having a polarity opposite to that of the charge stored in the floating gate is injected, due to a voltage between the second gate electrode and the second drain region, and a state in which a charge is stored in the floating gate is initialized.

19. The nonvolatile random access memory according to claim 1, wherein
the first semiconductor layer and the second semiconductor layer are formed on an insulator substrate or on an impurity diffusion layer of the second conductivity type that is set to such a potential state that junctions between the first semiconductor layer and the impurity diffusion layer of the second conductivity type and between the second semiconductor layer and the impurity diffusion layer of the second conductivity type are in a reverse-direction bias state, and sides of the first semiconductor layer and the second semiconductor layer are surrounded by an element isolation film.

20. The nonvolatile random access memory according to claim 1, further comprising:
   a memory cell array comprising a plurality of nonvolatile memory cells of claim 1 where a number of the memory cells are aligned in rows and columns;
   a number of first word lines, to each of which first word lines the second drain regions of the memory cells in a same row are connected;
   a number of second word lines, to each of which second word lines the second source regions and second semiconductor layers of the memory cells in the same row are connected;
   a number of bit lines, to each of which the first drain regions of the memory cells in a same column are connected;
   one or more source lines, to each of which source lines the first source regions of the memory cells in the same row or column, or all of the memory cells within the memory cell array are connected; and
   a voltage control means arranged to control a voltage to be applied to each of the first word lines, the second word lines, the bit lines and the source lines.

* * * * *